(12) United States Patent
Ly et al.

(10) Patent No.: US 10,331,361 B2
(45) Date of Patent: *Jun. 25, 2019

(54) SELF-ADDRESSING MEMORY

(71) Applicant: NATIONAL INSTRUMENTS CORPORATION, Austin, TX (US)

(72) Inventors: Tai A. Ly, Austin, TX (US); Swapnil D. Mhaske, Highland Park, NJ (US); Hojin Kee, Austin, TX (US); Adam T. Arnesen, Pflugerville, TX (US); David C. Uliana, Austin, TX (US); Newton G. Petersen, Emporia, KS (US)

(73) Assignee: National Instruments Corporation, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/397,107

(22) Filed: Jan. 3, 2017

(65) Prior Publication Data
US 2017/0115885 A1 Apr. 27, 2017

Related U.S. Application Data

(63) Continuation of application No. 14/523,413, filed on Oct. 24, 2014, now Pat. No. 9,569,119.
(Continued)

(51) Int. Cl.
*G06F 3/06* (2006.01)
*H03M 13/11* (2006.01)
(Continued)

(52) U.S. Cl.
CPC .......... *G06F 3/0616* (2013.01); *G06F 3/064* (2013.01); *G06F 3/0604* (2013.01);
(Continued)

(58) Field of Classification Search
CPC .... G06F 3/0604; G06F 3/0616; G06F 3/0622; G06F 3/064; G06F 3/0661; G06F 3/0673;
(Continued)

(56) References Cited

U.S. PATENT DOCUMENTS

| 4,001,566 A | 1/1977 | Stevenson |
| 5,586,269 A | 12/1996 | Kubo |

(Continued)

FOREIGN PATENT DOCUMENTS

| GB | 0816146.5 B | 1/2010 |
| JP | 2009146229 A | 2/2009 |

OTHER PUBLICATIONS

Ito, Kazuhito and Takahiro Watanabe, "Self-Hazard Technique to Reduce Memory Access Stage of Pipelined Processor," Jul. 5, 2014; Saitama University, Saitama, Japan, (6 pages).
(Continued)

*Primary Examiner* — Pierre Miche Bataille
(74) *Attorney, Agent, or Firm* — Meyertons Hood Kivlin Kowert and Goetzel PC; Jeffrey C. Hood; Michael B. Davis

(57) ABSTRACT

Techniques are disclosed relating to self-addressing memory. In one embodiment, an apparatus includes a memory and addressing circuitry coupled to or comprised in the memory. In this embodiment, the addressing circuitry is configured to receive memory access requests corresponding to a specified sequence of memory accesses. In this embodiment, the memory access requests do not include address information. In this embodiment, the addressing circuitry is further configured to assign addresses to the memory access requests for the specified sequence of memory accesses. In some embodiments, the apparatus is configured to perform the memory access requests using the assigned addresses.

20 Claims, 21 Drawing Sheets

```
Store a specified sequence of memory accesses that corresponds to a
function to be performed, where the specified sequence has first memory
                         access constraints
                              1810
```

```
Reorder the specified sequence of memory accesses to create a reordered
sequence of memory accesses that has second, different memory access
constraints, where the reordered sequence of memory accesses is usable
              to access a memory to perform the function
                              1820
```

Related U.S. Application Data

(60) Provisional application No. 62/045,832, filed on Sep. 4, 2014.

(51) Int. Cl.
*G06F 11/10* (2006.01)
*G06F 13/16* (2006.01)
*G11C 7/10* (2006.01)
*H03M 13/00* (2006.01)

(52) U.S. Cl.
CPC .......... *G06F 3/0622* (2013.01); *G06F 3/0659* (2013.01); *G06F 3/0661* (2013.01); *G06F 3/0673* (2013.01); *G06F 11/1076* (2013.01); *G06F 13/1615* (2013.01); *G06F 13/1626* (2013.01); *G11C 7/1039* (2013.01); *H03M 13/1102* (2013.01); *H03M 13/114* (2013.01); *H03M 13/1105* (2013.01); *H03M 13/6563* (2013.01); *H03M 13/6566* (2013.01); *H03M 13/6569* (2013.01); *Y02D 10/14* (2018.01)

(58) Field of Classification Search
CPC ............ G06F 3/0659; H03M 13/6563; H03M 13/1105
USPC .......................................... 711/169, 154, 167
See application file for complete search history.

(56) References Cited

U.S. PATENT DOCUMENTS

| | | | |
|---|---|---|---|
| 5,923,614 A | 7/1999 | Erickson | |
| 8,095,743 B2 | 1/2012 | Vierthaler | |
| 9,274,931 B2* | 3/2016 | Bowler | G06F 8/443 |
| 2001/0016901 A1* | 8/2001 | Topham | G06F 8/441 |
| | | | 712/217 |
| 2002/0066089 A1 | 5/2002 | Clarke | |
| 2004/0117716 A1 | 6/2004 | Shen | |
| 2007/0239973 A1* | 10/2007 | Wiese | G06F 9/30145 |
| | | | 712/233 |
| 2007/0266187 A1 | 11/2007 | Senoo | |
| 2008/0091922 A1 | 4/2008 | Fluhr | |
| 2008/0235539 A1* | 9/2008 | Yamada | G01R 31/31813 |
| | | | 714/703 |
| 2010/0146362 A1 | 6/2010 | Pisek | |
| 2010/0229162 A1 | 9/2010 | Hada | |
| 2011/0283090 A1* | 11/2011 | Mejdrich | G06F 9/30065 |
| | | | 712/208 |
| 2016/0070499 A1* | 3/2016 | Ly | G06F 3/0616 |
| | | | 711/163 |

OTHER PUBLICATIONS

Gallager, Robert G.; book: Low-Density Parity-Check Codes, Jul. 1963, Cambridge, Massachusetts, US (90 pages).

Sun, Yang; Joseph R. Cavallaro; Tai Ly; "Scalable and Low Power LDPC Decoder Design Using High Level Algorithmic Synthesis" IEEE International SOC Conference 2009; Sep. 9-11, 2009; pp. 267-270 (4 pages).

Chavet, C.; P. Coussy; "A Memory Mapping Approach for Parallel Interleaver Design with Multiples Read and Write Accesses" Proceedings of 2010 IEEE International Symposium on Circuits and Systems (ISCAS); May 30, 2010-Jun. 2, 2010; pp. 3168-3171 (4 pages).

* cited by examiner

H Matrix 620

Figure 6A — H Matrix (Layer × Block)

| Layer | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| L1 | 57 |  |  |  | 50 |  | 11 |  | 50 |  |  | 79 |  | 1 | 0 |  |  |  |  |  |  |  |  |  |
| L2 | 3 |  | 28 |  | 0 |  |  |  | 55 | 7 |  |  |  | 0 | 0 |  |  |  |  |  |  |  |  |  |
| L3 | 30 |  |  |  | 24 | 37 |  |  | 56 | 14 |  |  |  |  | 0 | 0 |  |  |  |  |  |  |  |  |
| L4 | 62 | 53 |  |  | 53 |  |  | 3 | 35 |  |  |  |  |  |  | 0 | 0 |  |  |  |  |  |  |  |
| L5 | 40 |  |  | 20 | 66 |  |  | 22 | 28 |  |  |  |  |  |  |  | 0 | 0 |  |  |  |  |  |  |
| L6 | 0 |  |  |  | 8 |  | 42 |  | 50 |  |  | 8 |  |  |  |  |  | 0 | 0 |  |  |  |  |  |
| L7 | 69 | 79 | 79 |  |  |  | 56 |  | 52 |  |  |  | 0 |  |  |  |  |  | 0 | 0 |  |  |  |  |
| L8 | 65 |  |  |  | 38 | 57 |  |  | 72 |  |  | 27 |  |  |  |  |  |  |  | 0 | 0 |  |  |  |
| L9 | 64 |  |  |  | 14 | 52 |  |  | 30 |  |  | 32 |  |  |  |  |  |  |  |  | 0 | 0 |  |  |
| L10 |  | 45 |  | 70 | 0 |  |  |  | 77 | 9 |  |  |  |  |  |  |  |  |  |  |  | 0 | 0 |  |
| L11 | 2 | 56 |  | 57 | 35 |  |  |  |  |  |  | 12 |  |  |  |  |  |  |  |  |  |  | 0 | 0 |
| L12 | 24 |  | 61 |  | 60 |  |  | 27 | 51 |  |  |  |  | 16 | 1 |  |  |  |  |  |  |  |  | 0 |

Beta Matrix 640

Figure 6B

| Layer | | | Block Index | | | | |
|---|---|---|---|---|---|---|---|
| L1 | 0 | 4 | 6 | 8 | 10 | 12 | 13 |
| L2 | 0 | 2 | 4 | 8 | 9 | 13 | 14 |
| L3 | 0 | 4 | 5 | 8 | 9 | 14 | 15 |
| L4 | 0 | 1 | 4 | 7 | 8 | 15 | 16 |
| L5 | 0 | 3 | 4 | 7 | 8 | 16 | 17 |
| L6 | 0 | 4 | 6 | 8 | 11 | 17 | 18 |
| L7 | 0 | 1 | 2 | 6 | 8 | 12 | 18 | 19 |
| L8 | 0 | 4 | 5 | 8 | 10 | 19 | 20 |
| L9 | 0 | 4 | 5 | 8 | 11 | 20 | 21 |
| L10 | 1 | 3 | 4 | 8 | 9 | 21 | 22 |
| L11 | 0 | 1 | 3 | 4 | 10 | 22 | 23 |
| L12 | 0 | 2 | 4 | 7 | 8 | 11 | 12 | 23 |

Rearranged Beta Matrix 660

Figure 6C

| Layer | | | Block Index | | | | |
|---|---|---|---|---|---|---|---|
| L1 | 0 | 4 | 8 | 13 | 6 | 10 | 12 |
| L2 | 9 | 0 | 4 | 8 | 13 | 14 | 2 |
| L3 | 15 | 9 | 0 | 4 | 8 | 5 | 14 |
| L4 | 7 | 15 | 16 | 0 | 4 | 8 | 1 |
| L5 | 17 | 7 | 3 | 16 | 0 | 4 | 8 |
| L6 | 6 | 17 | 18 | 11 | 0 | 4 | 8 |
| L7 | 19 | 6 | 0 | 8 | 1 | 2 | 18 | 12 |
| L8 | 4 | 19 | 5 | 0 | 8 | 20 | 10 |
| L9 | 21 | 4 | 11 | 5 | 0 | 8 | 20 |
| L10 | 1 | 21 | 4 | 3 | 22 | 9 | 8 |
| L11 | 0 | 1 | 23 | 4 | 3 | 22 | 10 |
| L12 | 8 | 0 | 2 | 23 | 4 | 12 | 7 | 11 |

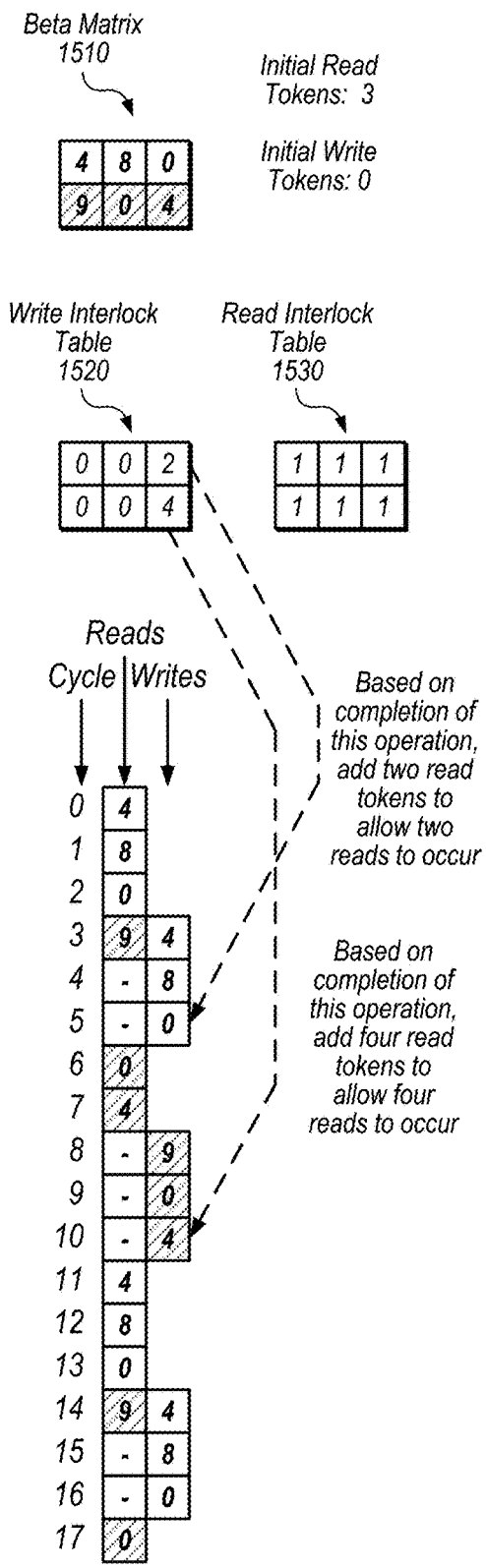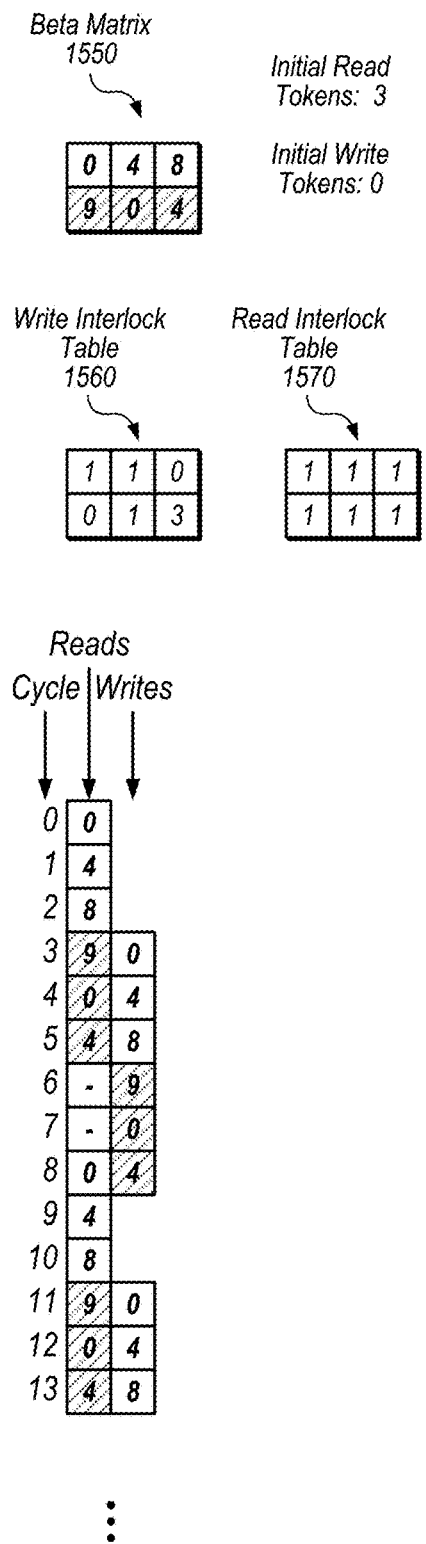
Figure 15A
Figure 15B

SELF-ADDRESSING MEMORY

PRIORITY DATA

This application is a continuation of U.S. patent application Ser. No. 14/523,413, filed on Oct. 24, 2014, which claims the benefit of U.S. Provisional Application No. 62/045,832, titled "Memory Configured to Avoid Access Hazards," filed on Sep. 4, 2014, whose inventors are Tai A. Ly, Swapnil D. Mhaske, Hojin Kee, Adam T. Arnesen, David C. Uliana, and Newton G. Petersen; the disclosures of each of which are incorporated by reference herein in their respective entireties as though fully and completely set forth herein.

TECHNICAL FIELD

The present disclosure relates to the field of computer memory, and more particularly to techniques involving a self-addressing memory system.

DESCRIPTION OF THE RELATED ART

Various computer programs require handling of hazards when accessing memory. Generally, when two operations access the same memory location, a computing system should ensure that the accesses occur in the proper order. Various algorithms use sequences of memory operations that are often performed iteratively. For example, error control codes, encryption, and various equation solving algorithms typically use complex matrices for which memory accesses must be performed in specified sequences for various operations.

Low-density parity-check (LDPC) codes are one example of error control code and are used to transmit information over potentially noisy channels. For example, the WiMAX and LTE standards utilize LDPC codes for data channels. LDPC typically uses a parity check matrix referred to as an "H matrix" to determine the makeup of incoming blocks of code. Decoding LDPC encoded messages involves iterative read/modify/write operations corresponding to different layers of the H matrix. Pipelining these operations may be desirable in order to decrease decode time, but dependencies between the memory accesses must be resolved to properly order the pipelined operations.

SUMMARY

Various embodiments of a self-addressing memory are presented below.

In one embodiment, an apparatus includes a memory and circuitry coupled to or comprised in the memory. In this embodiment, the circuitry is configured to receive a sequence of memory access requests for the memory, where the sequence of memory access requests is configured to access locations associated with entries in a matrix. In this embodiment, the circuitry is configured with memory access constraints for the sequence of memory access requests. In this embodiment, the circuitry is configured to grant the sequence of memory access requests subject to the memory access constraints, thereby avoiding memory access hazards for a sequence of memory accesses corresponding to the sequence of memory access requests.

In some embodiments, the apparatus includes pipeline circuitry configured to pipeline performance of the sequence of memory accesses. In these embodiments, the circuitry may be configured to stall pipelined performance of the sequence of memory access requests based on the memory access constraints. The memory access constraints may be specified using any of various formats and encodings. For example, in some embodiments interlock information indicates read/write pointer values. In other embodiments, interlock information indicates token values. In some embodiments, the sequence of memory access requests is based on iterative operations for processing rows of a matrix. In some embodiments, the circuitry is configured to prevent memory access hazards without receiving other information indicating the memory access hazards, i.e., without auxiliary information describing or characterizing the memory access hazards.

In one embodiment, a method includes determining a sequence of memory access requests for a program and generating information specifying memory access constraints based on the sequence of memory accesses, where the information is usable to avoid memory access hazards for the sequence of memory accesses. In this embodiment, the method further includes configuring first circuitry using the information, where the first circuitry is included in or coupled to a memory. In this embodiment, after the configuring, the first circuitry is operable to perform memory access requests to the memory corresponding to the sequence of memory accesses while avoiding the memory access hazards, without receiving other information indicating the memory access hazards. The configuring the first circuitry may be performed using a programmable hardware element, such as a field programmable gate array (FPGA), or other programmable hardware. Furthermore, the configuring may be performed at compilation time, at start of running the program, or at various times while the program is running to adapt to changing conditions or to improve any number of performance measures such as throughput, latency, power consumption, reliability, resource utilization, bit-error rate, etc. In some embodiments, the determining is performed using compile-time execution.

In one embodiment, a method includes storing a specified sequence of memory accesses that corresponds to a function to be performed. In this embodiment, the specified sequence of memory accesses has first memory access constraints. In this embodiment, the method further includes reordering the specified sequence of memory accesses to create a reordered sequence of memory accesses that has second, different memory access constraints. In this embodiment, the reordered sequence of memory accesses is usable to access a memory to perform the function. In some embodiments, performance estimates are determined for a plurality of reordered sequences of memory accesses, and one of the reordered sequences is selected based on the performance estimates. In some embodiments, the reordered sequence is used to compile a program usable to perform the function.

In one embodiment, an apparatus includes a memory and addressing circuitry coupled to or comprised in the memory. In this embodiment, the addressing circuitry is configured to receive memory access requests corresponding to a specified sequence of memory accesses. In this embodiment, the memory access requests do not include address information. In this embodiment, the addressing circuitry is further configured to assign addresses to the memory access requests for the specified sequence of memory accesses. In some embodiments, the apparatus is configured to perform the memory access requests using the assigned addresses.

Various techniques disclosed herein may improve memory access throughput, reduce complexity in devices coupled to an interlock memory, and/or allow for flexible programming or updating of an interlock memory for different applications, in some embodiments.

BRIEF DESCRIPTION OF THE DRAWINGS

A better understanding of the present disclosure can be obtained when the following detailed description is considered in conjunction with the following drawings, in which:

FIG. 6A illustrates an exemplary H matrix;

FIG. 6B illustrates one embodiment of a beta matrix and FIG. 6C illustrates one embodiment of a rearranged beta matrix;

FIGS. 15A and 15B illustrate exemplary beta matrices, interlock tables, and pipelined execution of memory access operations according to one embodiment;

Figure 1A:
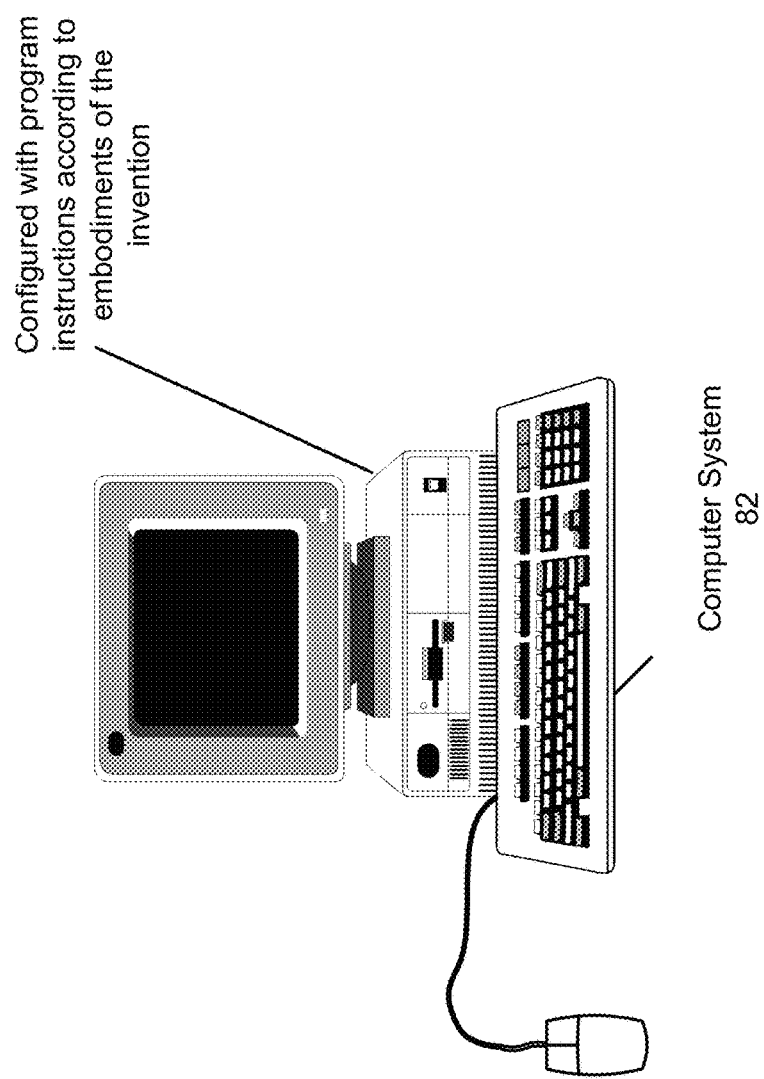
FIG. 1A illustrates a computer system configured to execute a program according to an embodiment of the present disclosure.

While the disclosure is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present disclosure as defined by the appended claims.

The term "configured to" is used herein to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component.

DETAILED DESCRIPTION

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

U.S. patent application Ser. No. 13/592,995 titled "Compile Time Execution," filed Aug. 23, 2012.

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include Lab VIEW®, DasyLab™, DIADem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Said another way, data flow programs execute according to a data flow model of computation under which program functions are scheduled for execution in response to their necessary input data becoming available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

FIG. 1A—Computer System

FIG. 1A illustrates an exemplary computer system 82 configured to execute a program, e.g., a graphical program, configured to program and/or utilize an interlock memory, according to some embodiments. Note that while some of the embodiments are described in terms of a graphical program, the techniques disclosed are broadly applicable to text based programs, as well, and so the described graphical program aspects of the described embodiments should be considered to be exemplary only, i.e., the novel techniques described with respect to graphical programs also apply to text based programs.

As shown in FIG. 1A, the computer system 82 may include a display device configured to display a graphical program as the graphical program is created and/or executed. The display device may also be configured to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present disclosure may be stored. For example, the memory medium may store one or more graphical (or text based) programs which are executable to perform the methods described herein. Additionally, the memory medium may store a graphical (or text based) programming development environment application used to create and/or execute such graphical (or text based) programs. The memory medium may also store operating system software, as well as other software for operation of the computer system. Various embodiments further include receiving or storing instructions and/or data implemented in accordance with the foregoing description upon a carrier medium.

Figure 1B:
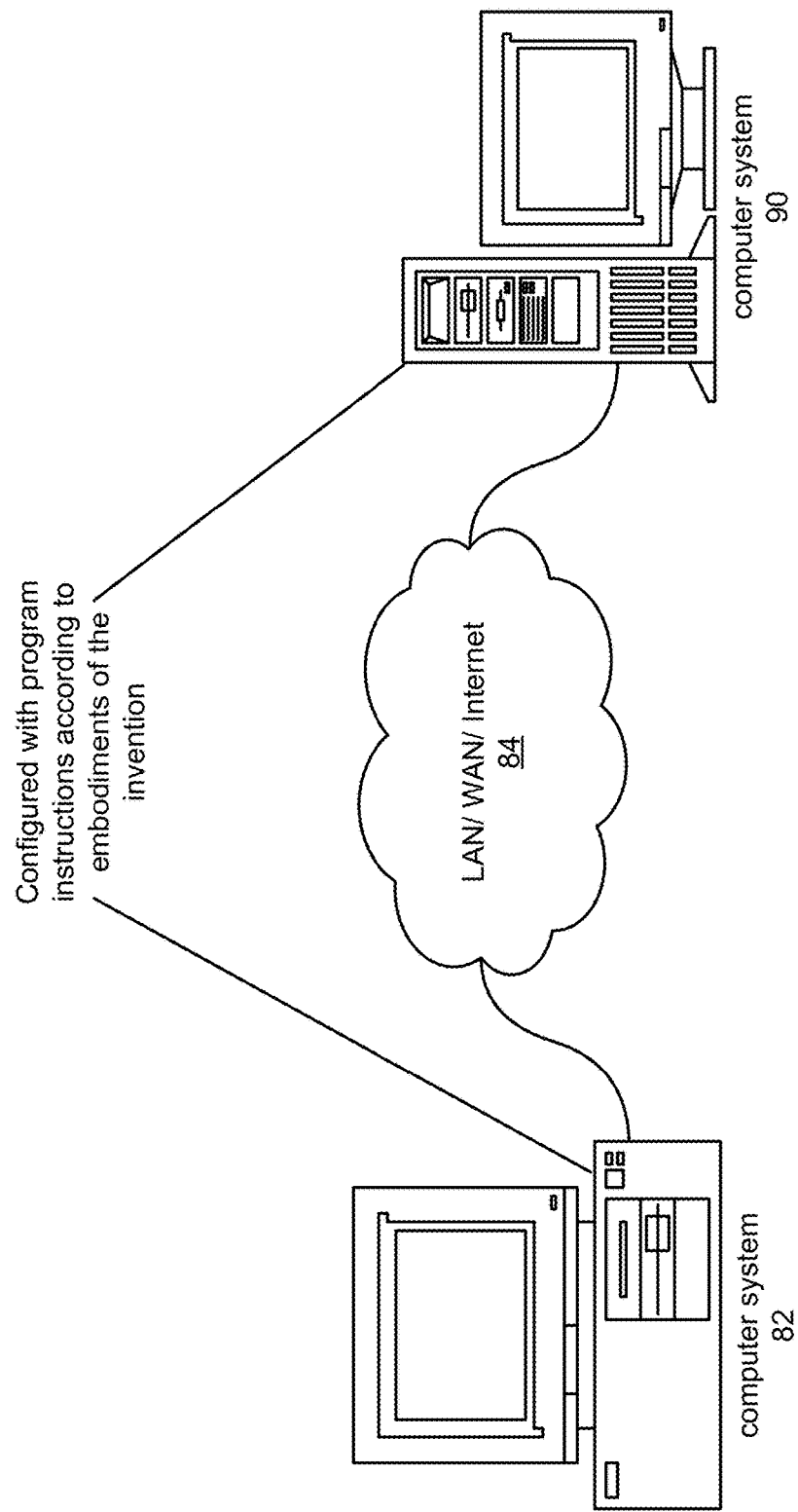
FIG. 1B illustrates a network system comprising two or more computer systems that may implement an embodiment of the present disclosure.

FIG. 1B—Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a graphical program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device coupled to the computer system 82. The device may include a programmable hardware element and/or may include a processor and memory medium which may execute a real time operating system. In one embodiment, the graphical program may be downloaded and executed on the device. For example, an application development environment with which the graphical program is associated may provide support for downloading a graphical program for execution on the device in a real time system.

Exemplary Systems

Embodiments of the present disclosure may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
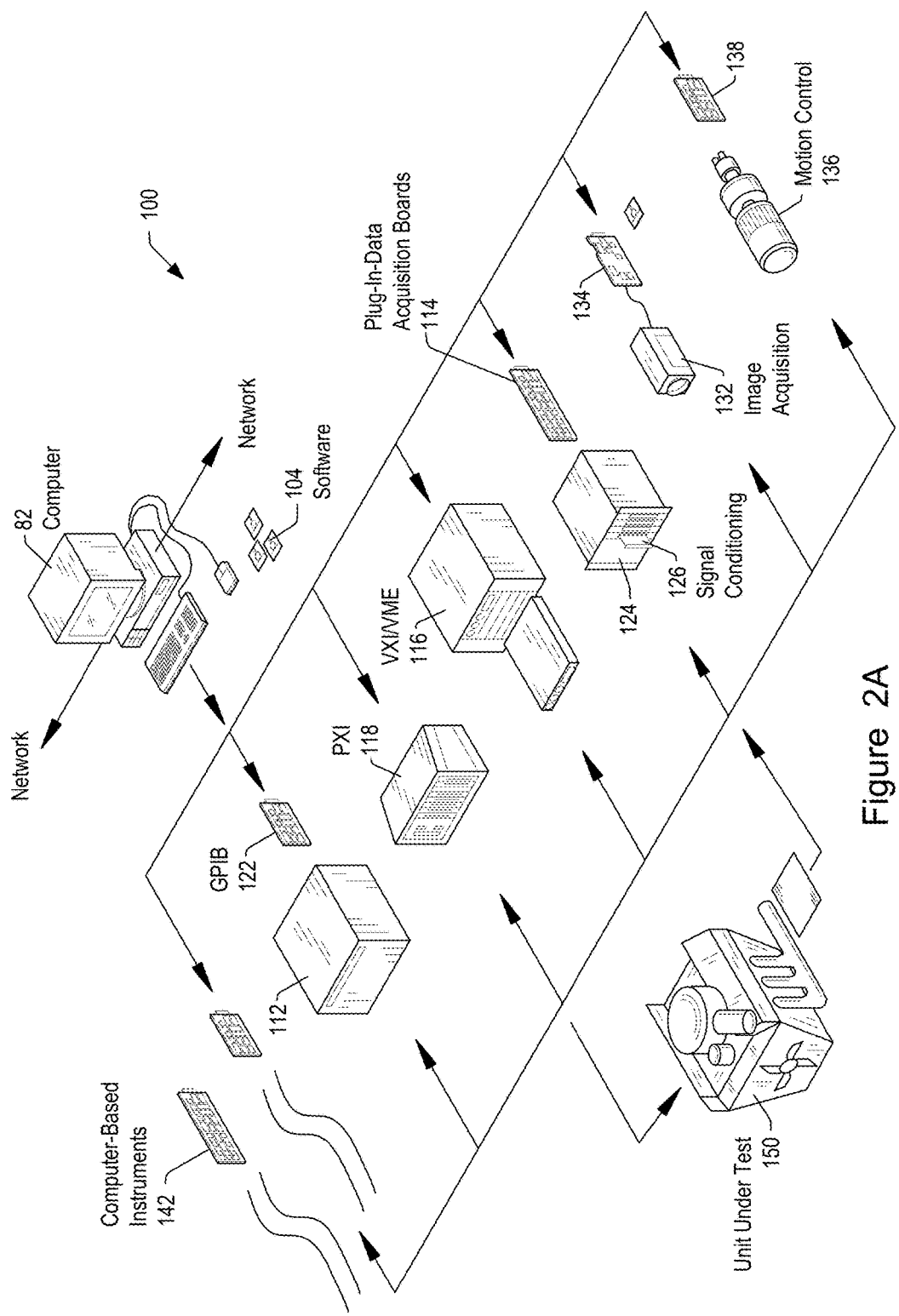
FIG. 2A illustrates an instrumentation control system according to one embodiment of the disclosure.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
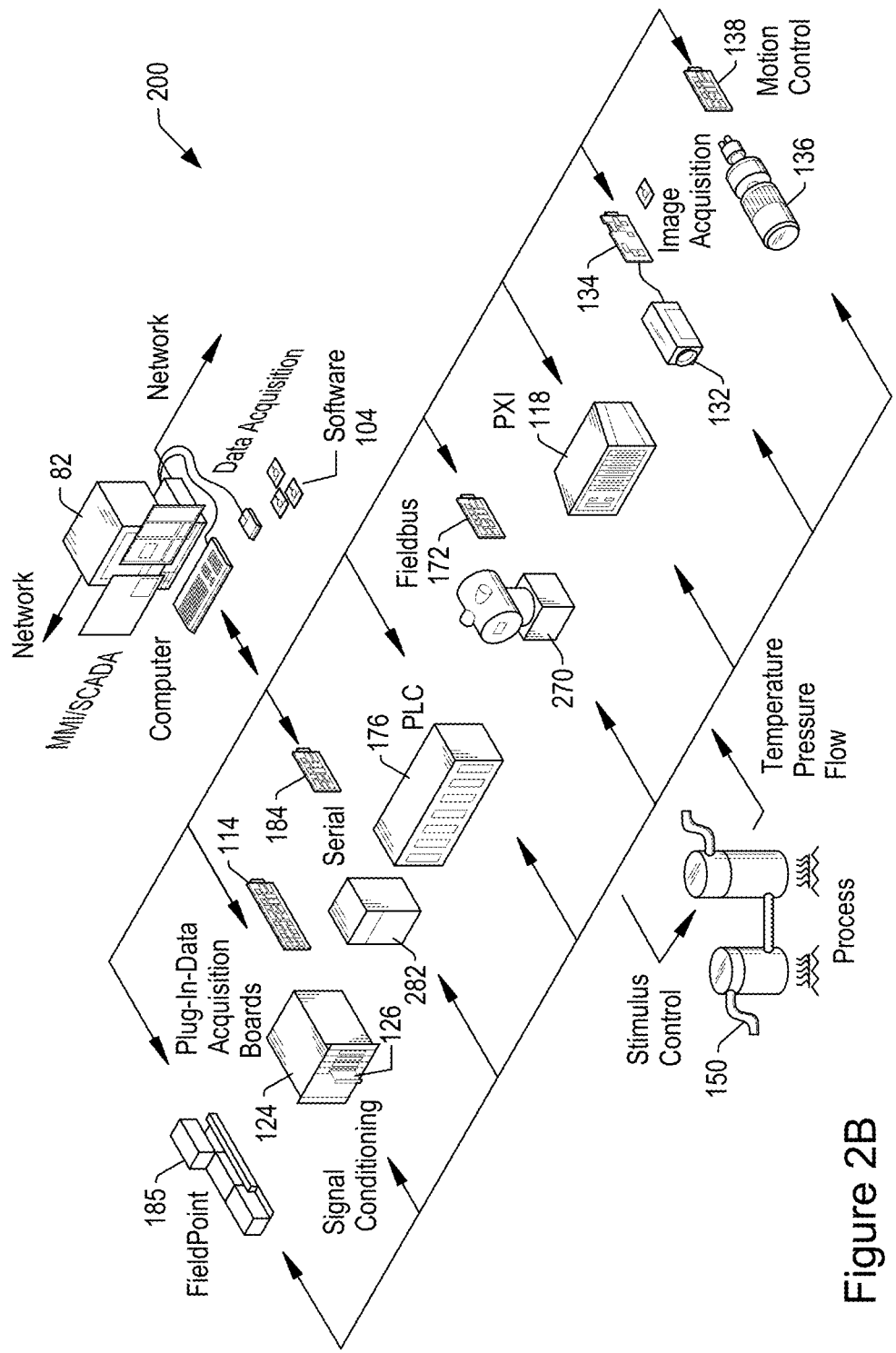
FIG. 2B illustrates an industrial automation system according to one embodiment of the disclosure.

FIG. 2B illustrates an exemplary industrial automation system 200 which may implement embodiments of the invention. The industrial automation system 200 is similar to the instrumentation or test and measurement system 100 shown in FIG. 2A. Elements which are similar or identical to elements in FIG. 2A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as Fieldpoint system 185, available from National Instruments Corporation, among other types of devices.

Figure 3A:
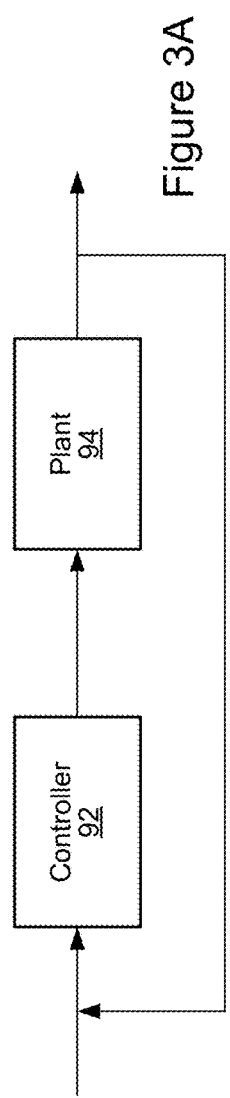
FIG. 3A is a high level block diagram of an exemplary system which may execute or utilize programs including graphical programs.

FIG. 3A is a high level block diagram of an exemplary system which may execute or utilize programs, e.g., graphical programs. FIG. 3A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92.

Figure 3B:
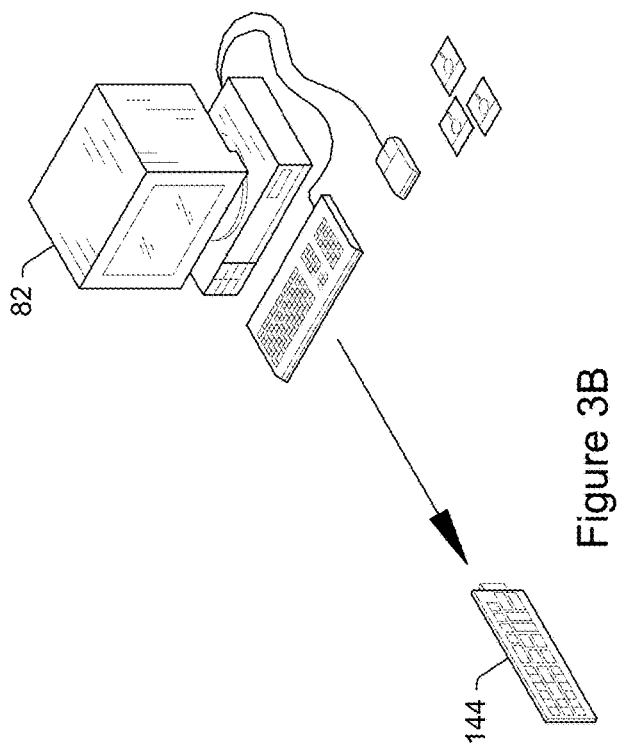
FIG. 3B illustrates an exemplary system which may perform control and/or simulation functions.

FIG. 3B illustrates an exemplary system which may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements a graphical program, or may be implemented in or as a real physical system, e.g., a car engine.

In one embodiment, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In one embodiment, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a program, e.g., a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
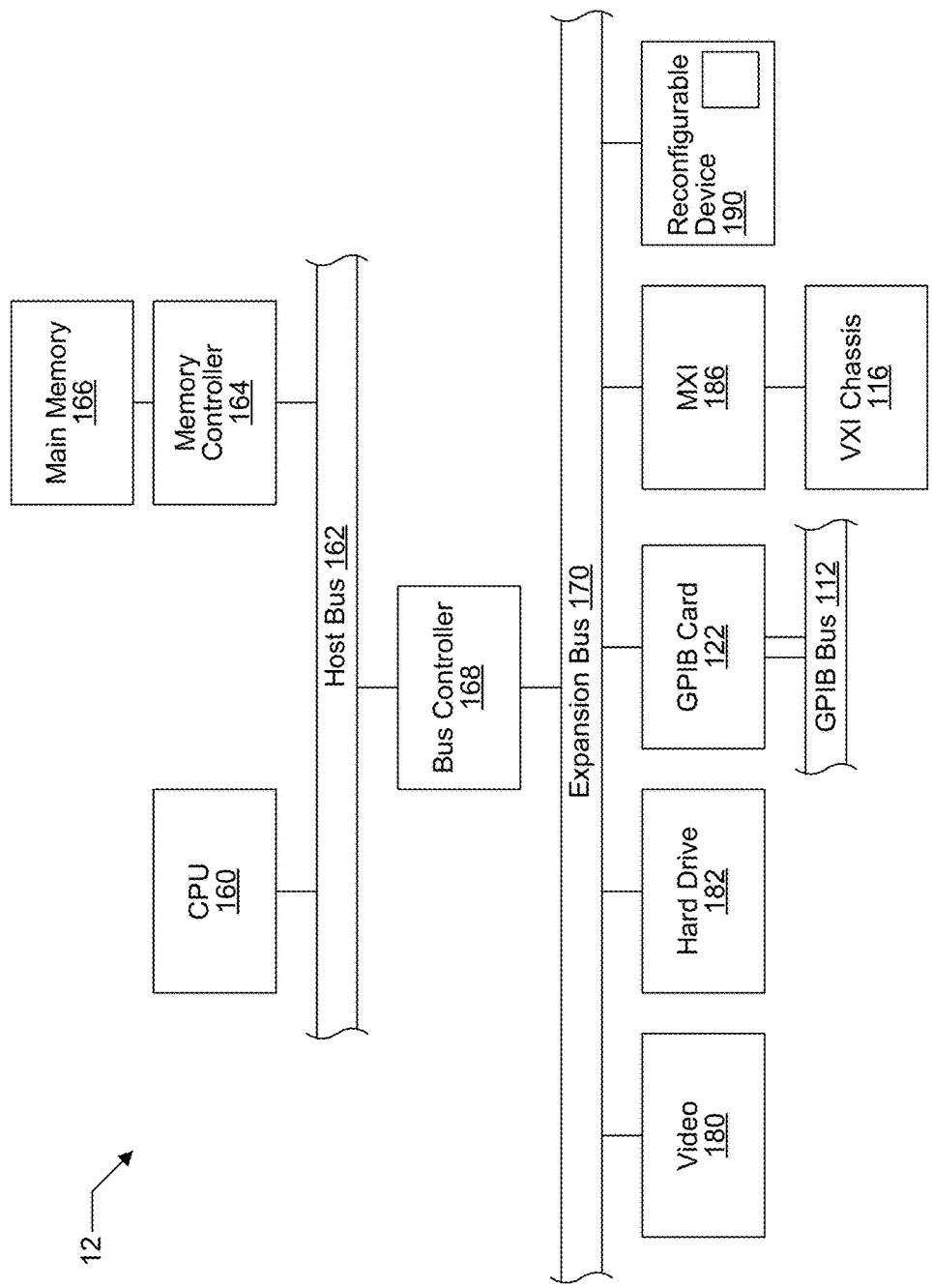
FIG. 4 is an exemplary block diagram of the computer systems of FIGS. 1A, 1B, 2A and 2B and 3B.

FIG. 4—Computer System Block Diagram

FIG. 4 is a block diagram 12 representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the one or more programs configured to program and/or utilize an interlock memory. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be configured to deploy a program, e.g., a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program. As noted above, in some embodiments, the program(s) may be text based.

Exemplary LDPC Decoder

Various embodiments discussed below with reference to FIGS. 5-16 involve techniques associated with decoding error correcting code, and low-density parity-check (LDPC) codes in particular. However, similar techniques may be applied to various algorithms in addition to and/or in place of such decoding. LDPC codes are discussed for explanatory purposes but are not intended to limit the scope of the present techniques. Embodiments of the interlock memory, performance modeling, hardware programming, memory sequence rearrangement, and/or self-addressing techniques discussed herein may be applied in various contexts for any of various algorithms which may or may not be explicitly listed herein.

Examples of such algorithms include, without limitation: error control code, graph encoding/decoding, source coding, cryptography, maximum likelihood detector, maximum a posteriori detector, compression, multiple-input multiple-output (MIMO) communications, beam-forming, beam-steering, differential equation solving, linear equation solving, linear algebra, optimization, detection and estimation, networking, machine learning, channel estimation, image processing, motion control, process control, bioinformatics, dynamic programming, big data applications, computational informatics, internet of things, etc. Thus sequences of memory accesses may be based on, and/or derived from, one or more of, without limitation: a parity-check matrix, a generator matrix, a channel matrix, the number of nodes and/or edges in a decoding algorithm, number of antennae, number of channel taps, compression ratio, angle range, degree of polynomial, number of equations, local and/or global maxima and/or minima, number of network nodes, etc.

Exemplary embodiments of linear algebra algorithms include, without limitation: symmetric rank-k update, symmetric rank-2k update, Cholesky factorization (decomposition of a positive-definite matrix into a product of a lower triangular matrix and its conjugate transpose), update Cholesky factorization (e.g., when a previously-decomposed matrix changes in some way), lower upper (LU) factorization (decomposition of a matrix into a product of a lower triangular matrix and an upper triangular matrix), QR factorization (decomposition of a matrix into a product of an orthogonal matrix Q and an upper triangular matrix R), update QR factorization, LQ factorization, triangular matrix inversion, reduction to Hessenberg form, reduction to bi-diagonal form, reduction to tri-diagonal form, triangular matrix Lyapunov equation solutions, triangular matrix Sylvester equation solutions, etc.

Figure 5:
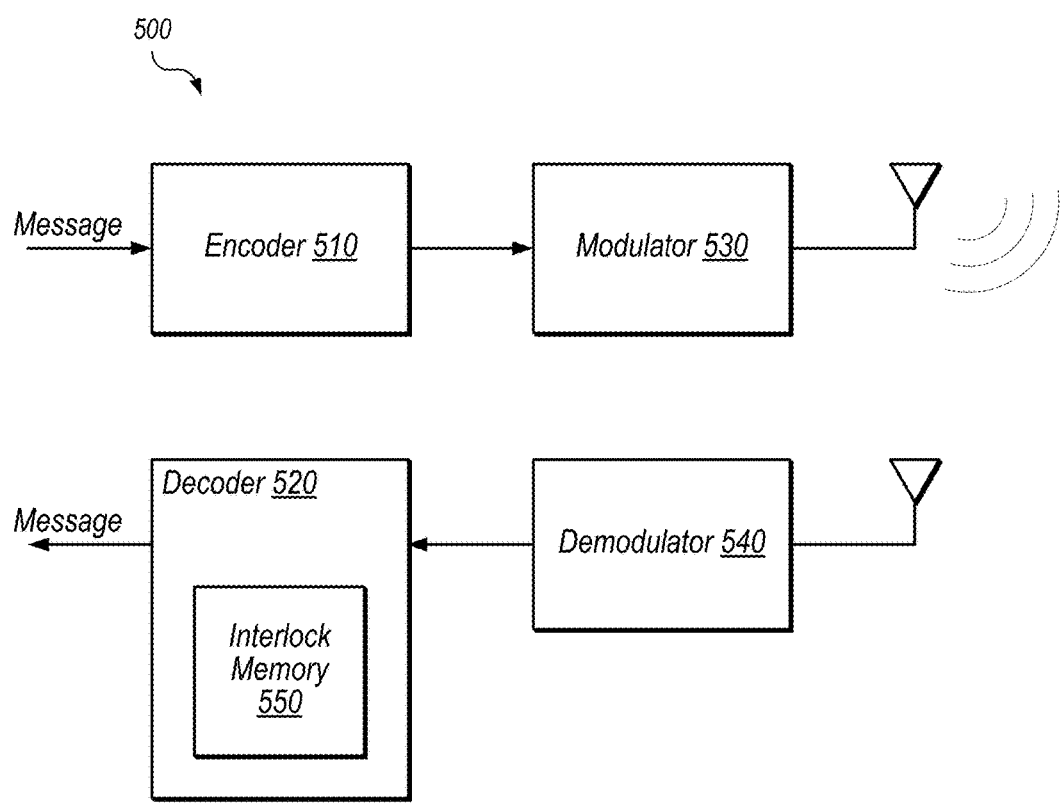
FIG. 5 illustrates one embodiment of a system that includes a decoder with an interlock memory.

FIG. 5 shows one embodiment of an exemplary system that includes an LDPC decoder. In the illustrated embodiment, system 500 includes encoder 510, decoder 520, modulator 530, and demodulator 540.

Encoder 510, in the illustrated embodiment, is configured to receive a message to be transmitted, encode the message, e.g., using an LDPC generator matrix, and send the encoded message to modulator 530.

Modulator 530, in the illustrated embodiment, is configured to transform and/or group bits of the encoded message into symbols for wireless transmission to an antenna coupled to demodulator 540, i.e., to modulate the encoded message for transmission. The wireless transmission may conform to any of various transmission standards. In other embodiments, the transmission may not be wireless.

Demodulator 540, in the illustrated embodiment, is configured to demodulate the received signals to generate the encoded message. However, because of noise in transmission, it may be difficult to determine the value of elements (e.g., the polarity of bits) in the encoded message. LDPC decoding may allow accurate reconstruction of the original message in many situations.

Decoder 520, in the illustrated embodiment, is configured to reconstruct the original message, e.g., based on a parity check matrix (which is often denoted using the letter 'H' and may be referred to as an "H matrix"), i.e., to decode the encoded message, thereby recovering the original message. In the illustrated embodiment, decoder 520 includes interlock memory 550, which may be configured to resolve or prevent access hazards corresponding to operations associated with the parity check matrix. Embodiments of interlock memory 550 are described in further detail below. Decoder 520 may include a pipelined data path for performing memory accesses based on the parity check matrix, and various techniques disclosed herein may reduce latency in the pipelined data path. Decoder 520 may be configured to transmit the decoded message to recipient hardware, not shown.

FIG. 6A shows a diagram illustrating an exemplary embodiment of an H matrix 620. In the illustrated embodiment, H matrix 620 is a parity check matrix and the number in each position indicates a cyclic shift amount. The blank positions in H matrix 620 indicate a "don't care," where the shift amount is not indicated, e.g., because it is not used.

In some embodiments, to decode a received signal using LDPC, decoder 520 is configured to iterate through the layers of H matrix 620 (12 layers in the illustrated embodiment, which correspond to the rows of the matrix) to decode a received signal. For example, decoder 520 may read the relevant positions in a layer, determine a minimum or maximum value, and update values for the layer based on the determined minimum or maximum before proceeding to the next layer. In the illustrated embodiment, H matrix 620 is a 12 by 24 matrix, but any of various matrix sizes may be used in other embodiments.

FIG. 6B shows a diagram illustrating an exemplary embodiment of a beta matrix 640. Beta matrix 640, in the illustrated embodiment, encodes memory read/write addresses for iterative processing of layers L1 through L12 of H matrix 620. The encoded addresses correspond to locations in interlock memory 550 in some embodiments. In the illustrated embodiment, beta matrix 640 is formed based on H matrix 620, and indicates the block index of positions in H matrix 620 that are relevant (e.g., are not "don't cares"). For example, the position at layer L1 and block index 4 in H matrix 620 has a value of 50, so that block index (4) is included in layer L1 in beta matrix 640. In the illustrated embodiment, beta matrix 640 also includes some blank "don't care" positions, which may be included in order to maintain a regular matrix.

In the illustrated embodiment, beta matrix 640 includes only a third the number of columns included in H matrix 620. This may increase LDPC decoding performance significantly, e.g., by up to three times in some embodiments, relative to performing operations for each position in H matrix 620.

Decoder 520, in some embodiments, is configured to process beta matrix 640 iteratively in layers. In this example, to process the first layer, decoder 520 is configured to read memory locations 0, 4, 6, 8, 10, 12, and 13, modify at least some of the retrieved data, and write modified data back to at least some of the same locations. In one embodiment, decoder 520 is configured to calculate a minimum value for a given layer and calculate new values to write back to the same locations based on the minimum value, before proceeding to the next layer. Thus, operations for a given layer may depend on the values written for the previous layer. It may be desirable to pipeline memory accesses to improve performance. However, note for example that the first location in layer 2 is the same as the first location in layer 1 (both location 0). Thus, the read for layer 2 for location 0 is dependent on the write for layer 1. In some embodiments, interlock memory 550 is configured to resolve this dependency by waiting to perform the read for layer 2 until the write for layer 1 has completed. This stalling of the read may ensure correctness. However, reducing such stalling may be desirable in order to increase read/write performance in pipelined implementations.

FIG. 6C shows a diagram illustrating one embodiment of a rearranged beta matrix 660. In the illustrated embodiment, rearranged beta matrix is formed by rearranging the positions in each row of beta matrix 640. This rearrangement may reduce read/write hazards and thus improve memory access performance. For example, consider the accesses to location 0 shown in bold. The read to location 0 for layer two has been shifted such that the write to location 0 for layer one may be completed before the read for layer two, thus avoiding the need to stall in pipelined implementations. Thus, in various embodiments, sequences of memory accesses may be rearranged to improve memory performance. This rearranging may be performed automatically by a compiler and/or by configuration circuitry for interlock memory 550, for example. Techniques for performance modeling and selecting a rearranged sequence of memory accesses are discussed below with reference to FIG. 12.

Figure 7A:
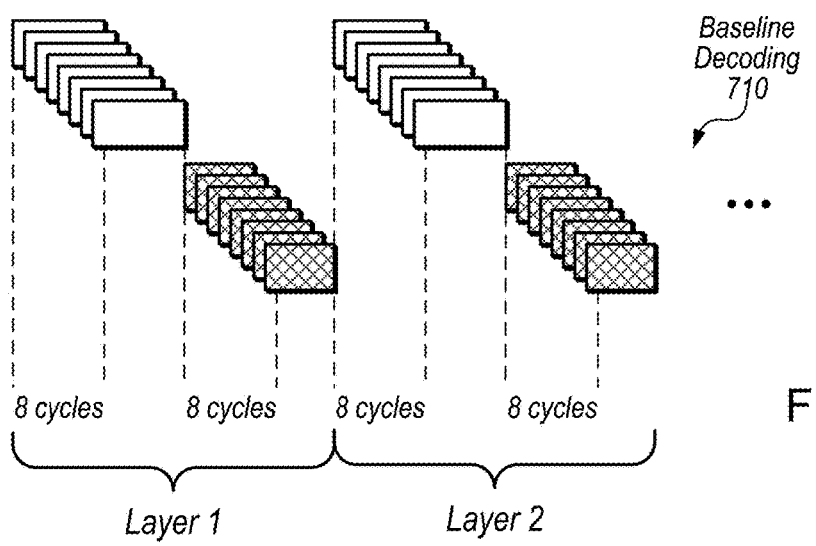
FIGS. 7A and 7B illustrate exemplary baseline decoding and pipelined decoding timelines respectively.
Figure 7B:
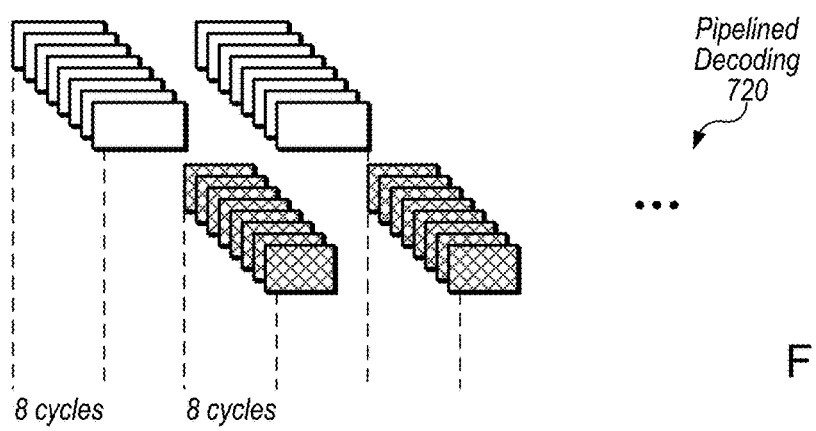

Referring now to FIG. 7A, a diagram illustrating a timeline of baseline decoding 710 according to one embodiment is shown. In FIGS. 7A-7B, shaded rectangles indicate writes while non-shaded rectangles indicate reads.

In the example of FIG. 7A, reads occur for all locations for layer 1 of beta matrix 660, which takes at least eight cycles (assuming that one read is initiated per cycle). All locations for layer 1 are then written, taking at least another eight cycles in the illustrated example. Processing for layer two then begins with a similar sequence of reads followed by a sequence of writes.

Referring now to FIG. 7B, a diagram illustrating a timeline of pipelined decoding 720 according to one embodiment is shown. In some embodiments, decoder 520 is configured to pipeline performance of memory accesses. In the illustrated example, reads for layer 2 begin as soon as reads for layer 1 are finished. This may improve decoding performance substantially, e.g., by up to two times, relative to the baseline decoding 710. Note that hazards must still be resolved or prevented (e.g., by inserting bubbles into the pipeline), but that rearranging a sequence of memory accesses (e.g., using rearranged beta matrix 660) may greatly reduce hazards in some embodiments.

Various pipelined memory access approaches are discussed herein, but it should be noted that in other embodiments the disclosed techniques may be used in the context of non-pipelined memory accesses.

In some embodiments, memory accesses may be fully pipelined such that one or more reads and writes are issued every cycle if available, barring stalls to resolve hazards (not shown in FIG. 7B). In some embodiments, a memory may be multi-ported, allowing multiple reads and/or writes to issue in a given cycle, which may further increase performance relative to baseline decoding 710.

Exemplary Interlock Memory

Figure 8A:
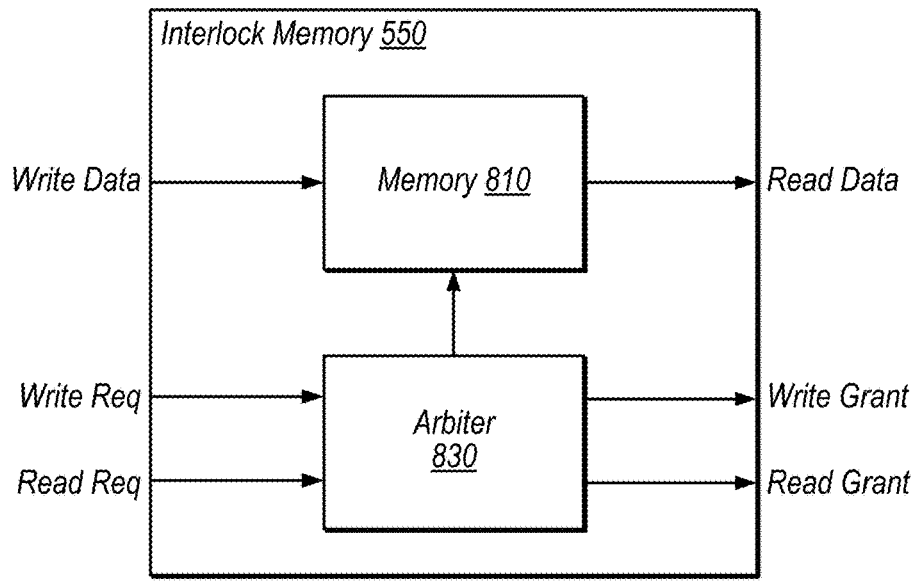
FIGS. 8A and 8B illustrate respective embodiments of an interlock memory.

FIG. 8A shows a block diagram illustrating one embodiment of interlock memory 550. In the illustrated embodiment, interlock memory 550 includes memory 810 and arbiter 830. Arbiter 830, in the illustrated embodiment, includes circuitry configured to receive read and write requests and grant the requests, resolving or preventing/avoiding any hazards in accessing memory 810 in the process. Interlock memory 550 may be configured to avoid memory access hazards without receiving information indicating the hazards along with memory access requests corresponding to the sequence (e.g., interlock memory 550 may be configured to avoid the hazards based on internal configuration). Arbiter 830 may be configured with memory access constraints for the sequence of memory access requests, exemplary embodiments of which are described below with reference to FIGS. 9 and 14-15. These memory access constrains may be referred to as "interlock information." In some embodiments, interlock information is populated based on a specified sequence of memory accesses to be performed using interlock memory 550.

As used herein, circuitry being "configured with" or "configured using" memory access constraints is intended to include configurations in which: 1) the circuitry stores information, e.g., such as a data structure or table which contains information regarding the memory access constraints 2) the circuitry includes dedicated circuitry configured to implement the memory access constraints (e.g., an ASIC), and/or 3) the circuitry includes programmable circuitry that is programmed to implement the memory access constraints. Hazard circuitry configured with memory access constraints may be grouped in one location or may be distributed (e.g., among stages of a pipelined memory access data path), in some embodiments.

Memory 810, in the illustrated embodiment, is configured to store received write data and provide read data, as allowed by arbiter 830. In some embodiments, memory 810 is multi-ported to allow initiation of multiples reads and/or multiple writes in a given cycle. For example, dual-ported embodiments of memory 810 may allow initiation of writes to two different locations in the same cycle. In some embodiments, memory 810 includes multiple banks. In some embodiments, each bank allows initiation of only one read and one write per cycle, but different banks may be accessed in the same cycle, e.g., concurrently.

Figure 8B:
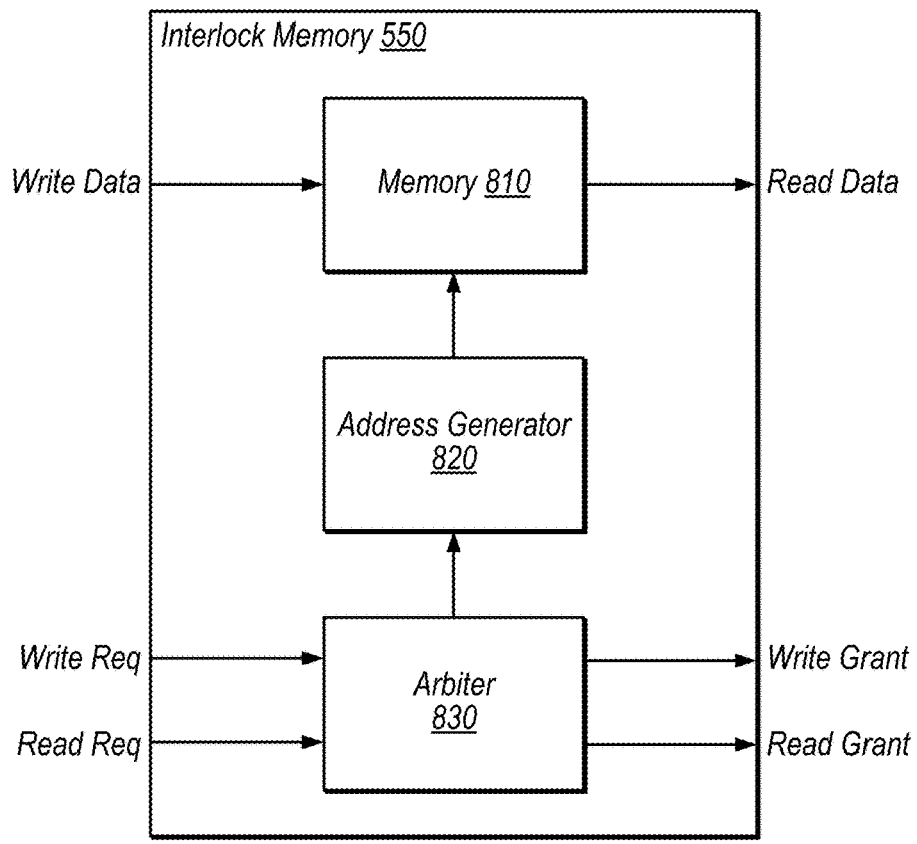

FIG. 8B shows a block diagram illustrating another embodiment of interlock memory 550. In the illustrated embodiment, interlock memory 550 includes address generator 820. Other elements of FIG. 8B may be configured as described above with reference to similarly numbered elements of FIG. 8A. Address generator 820, in the illustrated embodiment, includes circuitry configured to generate addresses for read and write requests. For example, interlock memory 550 may be configured for a particular array or matrix of memory accesses and address generator 820 may be configured to assign addresses to requests based on the sequence in which they are received. This may allow interlock memory 550 to be self-addressing, in some embodiments, such that programs can simply provide memory access requests, without address information, and interlock memory 550 is configured to generate appropriate addresses for corresponding accesses. In some embodiments, the sequence and/or addresses of memory accesses in a program are determined during compilation, which may include compile-time execution as discussed below with reference to FIG. 11. In some embodiments, interlock memory 550 includes one or more programmable hardware elements such that it is easily reconfigurable for different programs and/or algorithms.

In some embodiments, interlock memory 550 may include additional elements (not shown) configured to perform data forwarding, caching, prefetching, etc. associated with memory systems. In some embodiments, interlock memory 550 includes look-ahead circuitry configured to perform and/or adjust one or more of caching, prefetching, data forwarding, etc., based on upcoming memory access addresses to improve performance. In various embodiments, interlock memory 550 is included in a device such as an LDPC decoder or any of various appropriate devices. The various techniques discussed herein may be used to improve performance of any of various devices that include one or more interlock memories.

Figure 9:
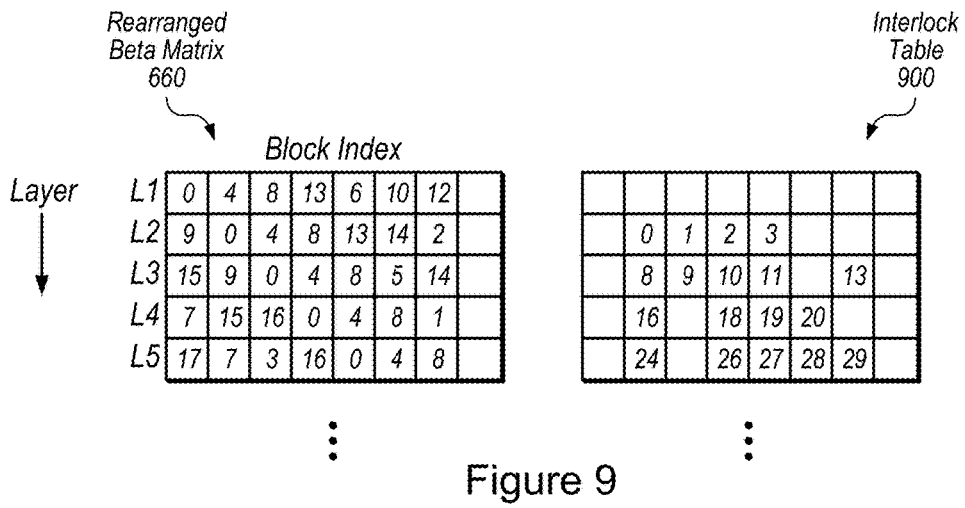
FIG. 9 illustrates one embodiment of an interlock table.

FIG. 9 shows a replication of the first five levels of rearranged beta matrix 660 and a corresponding interlock table 900. In various embodiments, interlock tables are used to specify memory access constraints for a sequence of memory accesses. The interlock tables may be stored in an interlock memory system and/or various circuitry may be otherwise configured with the memory access constraints (e.g., rather than maintaining the particular information specified by a given interlock table). The illustrated interlock table(s) are provided to facilitate explanation of particular memory access constraints. In some embodiments, interlock table 900 is generated for a given program or matrix and interlock memory 550 is configured with the memory access constraints specified by interlock table 900. In the illustrated embodiment, blank entries in interlock table 900 indicate that a corresponding access may be performed at any time because there are no hazards for that access.

In some embodiments, interlock memory 550 includes a read counter and a write counter, which are initialized to zero before executing a program. In these embodiments, when performing a given read operation, interlock memory 550 may be configured to compare the current write pointer to an entry in interlock table 900 corresponding to the read pointer and allow the read only if the write pointer is greater than the entry. For example, consider the entry in row 3, column 3 in rearranged beta matrix 660, which indicates location 0. The corresponding entry in interlock table 900 contains a 9. Thus, in this embodiment, a read cannot be performed from location 0 for row 3, column 3 in rearranged beta matrix 660 until the write counter is at least 10. Note that when the write counter is 10, for this sequence of memory operations, location 0 will have been written (based on row 2, column 2 in rearranged beta matrix 660), and so a potential hazard has been avoided. Similar techniques may be used for writes. For example, in some embodiments, interlock memory 550 is configured to grant a write only if the current read pointer is greater than an entry in the interlock table indicated by the write pointer.

In some embodiments, interlock memory 550 is not configured to perform hazard checks for write operations because hazards are already resolved by dataflow. For example, for rearranged beta matrix 660, write after read hazards are not present because the sequence already ensures that reads for a given layer and the previous layer will be completed before a given write to interlock memory 550 is requested (in this embodiment, writes for a given level are not initiated until reads for the entire row have completed in order to find a minimum value).

Figure 10:
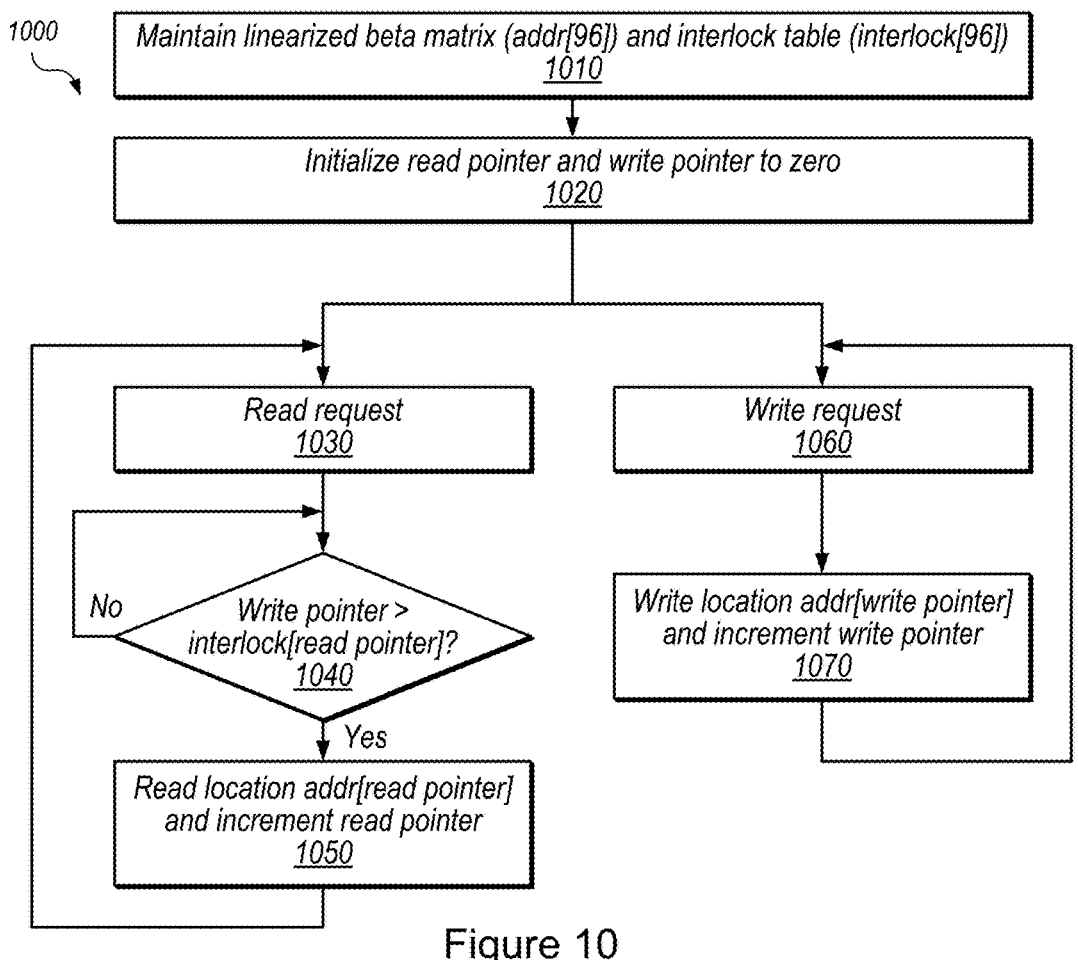
FIG. 10 illustrates one embodiment of a method for operating an interlock memory.

FIG. 10 shows a flow diagram illustrating one embodiment of a method 1000 for resolving or preventing data hazards. The method shown in FIG. 10 may be used in conjunction with any of the computer systems, devices, circuits, elements, or components disclosed herein, among others. In various embodiments, some of the method elements (also referred to herein as "blocks") shown may be performed concurrently, in a different order than shown, or may be omitted. Additional method elements may also be performed as desired. Flow begins at block 1010.

At block 1010, arrays for a linearized beta matrix (addr[96]) and interlock table (interlock[96]) are maintained. These arrays may be generated by using raster scan ordering on beta matrix 660 and interlock table 900. One or both of these arrays are stored in interlock memory 550 in some embodiments. In other embodiments, hazard circuitry is otherwise configured with information from one or both of these arrays. In the illustrated embodiment, rearranged beta matrix 660 may be used as an address table to generate addresses for received memory access requests. Flow proceeds to block 1020.

At block 1020, read and write pointers are initialized to zero. Flow proceeds to blocks 1030 and 1060.

At block 1030, a read request is received. Flow proceeds to decision block 1040.

At decision block 1040, it is determined whether the write pointer is greater than the value in the interlock table at an index of the read pointer (interlock[read pointer]). If the write pointer is greater, flow proceeds to block 1050. Otherwise, flow proceeds back to decision block 1040 (e.g., interlock memory 550 is configured to wait to grant the read request until the write pointer is greater than the value at interlock[read pointer].

At block 1050, the location indicated by a position in the beta matrix at an index of the read pointer (addr[read pointer]) is read. Thus, the requested read operation is performed. Flow returns to block 1030.

At block 1060, a write request is received. Flow proceeds to block 1070.

At block 1070, data for the write request is written to the location indicated by a position in the beta matrix at an index of the write pointer (addr[write pointer]). Thus, the requested write operation is performed. In this embodiment, the write pointer is incremented (which may allow one or more waiting read requests to proceed). Flow returns to block 1060.

In other embodiments, writes may be checked in a similar manner as utilized for reads in block 1040. In these embodiments, interlock memory 550 is configured to stall a given write until the read pointer is greater than interlock[write pointer]. This block is omitted in the illustrated embodiment because of the nature of the writes in the example beta matrix 660, as discussed above. In still other embodiments, this block may be included for writes but block 1040 may be omitted for reads, e.g., for programs in which dataflow ensures that reads will not cause hazards.

Generating Interlock Information

Figure 11:
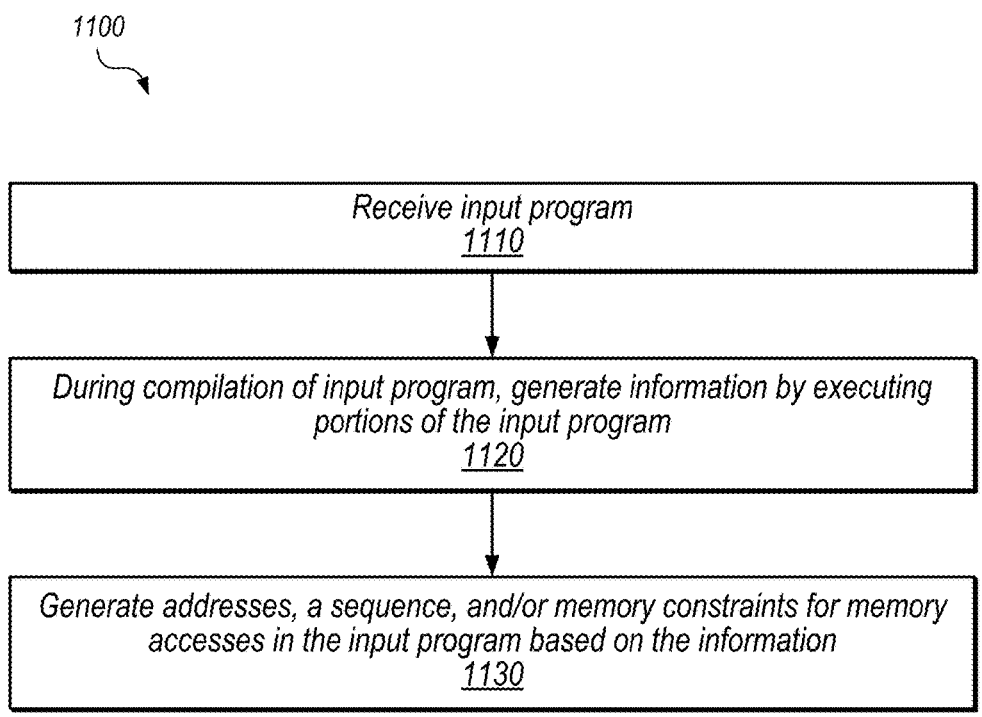
FIG. 11 illustrates one embodiment of a method for generating information for an interlock memory using compile-time-execution.

FIG. 11 shows a flow diagram illustrating one embodiment of a method 1100 for determining sequences and/or addresses of memory accesses for a program. The method shown in FIG. 11 may be used in conjunction with any of the computer systems, devices, circuits, elements, or components disclosed herein, among others. In various embodiments, some of the method elements (or blocks) shown may be performed concurrently, in a different order than shown, or may be omitted. Additional method elements may also be performed as desired. Flow begins at block 1110.

At block 1110, an input program is received. The program may include memory access operations, e.g., memory reads and/or writes. In some embodiments, a compiler receives the program for compilation for a system that includes interlock memory 550. Flow proceeds to block 1120.

At block 1120, during compilation of the input program, information is generated by executing portions of the input program. Exemplary techniques for executing portions of an input program during compilation are described in U.S. patent application Ser. No. 13/592,995, filed Aug. 23, 2012 and titled "Compile Time Execution," which is incorporated herein by reference in its entirety. In some embodiments, these techniques are used to generate information for programming interlock memory 550. Flow proceeds to block 1130.

At block 1130, addresses, a sequence, and/or memory access constraints are generated for memory accesses in the input program based on the information. For example, in some embodiments, a compiler is configured to generate one or more address tables (e.g., a beta matrix) and memory access constraints for one or more interlock tables based on the information. In these embodiments, the compiler may be configured to partially execute the input program in order to determine the order of memory accesses in the program, addresses of the memory accesses, and/or hazards between the memory accesses. In some embodiments, the address information is used for self-addressing. In some embodiments, hazard circuitry for interlock memory 550 is configured with determined memory access constraints and used to avoid hazards when executing the input program. In some embodiments, this configuring may be performed automatically, e.g., when the input program is to be compiled and programmed onto particular hardware. In some embodiments, the compiler is configured to rearrange the sequence of memory operations in order to improve performance using interlock memory 550. In some embodiments, the rearrangement may alter compilation of the program to use the rearranged sequence. Flow ends at block 1130.

In other embodiments, interlock information may be generated using other techniques, in place of and/or in addition to compile time execution. For example, in some embodiments, a program, (e.g., a graphical program) may allow a user to enter an array or matrix corresponding to memory accesses and may be configured to generate interlock and/or address table(s) based on the entered information. For example, in one embodiment, a program is configured to generate a beta matrix and one or more interlock tables based on an input H matrix. In these embodiments, interlock information may be generated before compiling or executing an associated input program at all. In other embodiments any of various programs, arrays, matrices, or other information associated with sets of memory accesses may be input to a program for configuring an interlock memory.

In various embodiments, information (e.g., interlock information and/or address table(s)) may be transferred to an interlock memory at any of various appropriate times. For example, the information may be transferred at the beginning of execution of a program or while the program is running. In some embodiments, sequence and/or interlock information may be updated during execution to adapt to changing conditions or improve one or more performance measures. Exemplary performance measures include, without limitation: throughput, latency, power consumption, reliability, resource utilization, and bit-error rate.

Performance Estimates

In some embodiments, a program (e.g., a graphical program) is configured to run cycle accurate simulations for interlock memory 550 for an input program or a sequence of memory access operations. In some embodiments, the cycle accurate simulations are achieved or performed based on knowledge of the sequence of memory operations and the pipelined nature of memory accesses. For example, the number of stalls and number of cycles for each stall may be determined for a particular sequence of accesses. In some embodiments, performance estimates may be generated based on such simulations. In some embodiments, sequences of memory accesses may be reordered to improve performance based on performance estimates.

Figure 12:
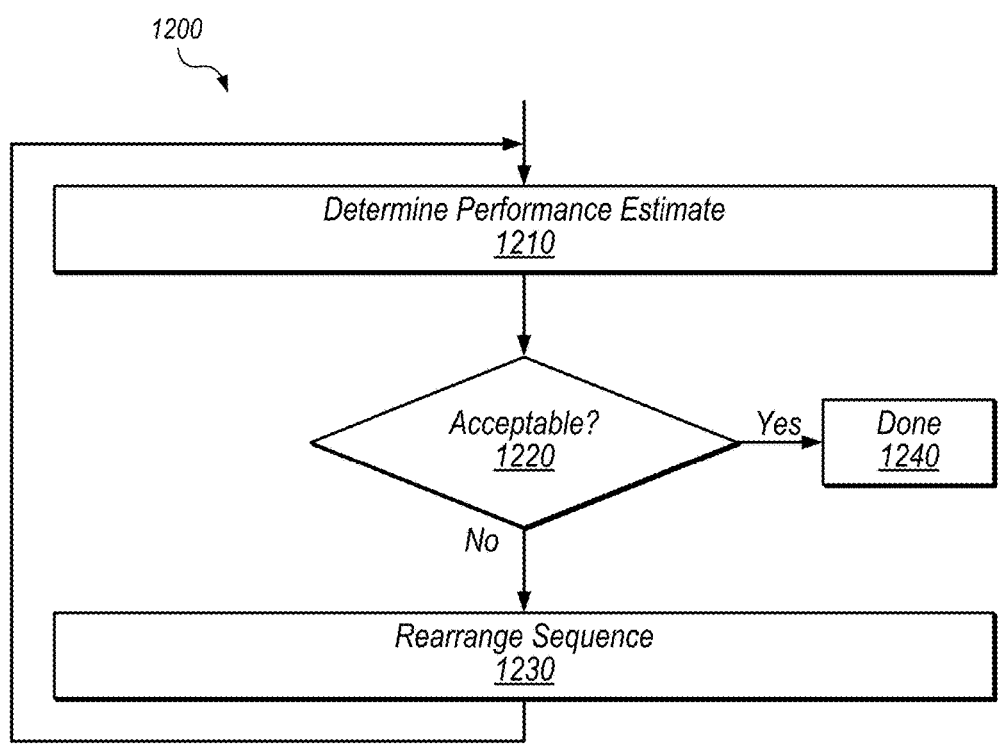
FIG. 12 illustrates one embodiment of a method for determining performance estimates and rearranging memory access sequences based on performance estimates.

FIG. 12 shows a flow diagram illustrating one embodiment of a method for generating a rearranged or reordered sequence of memory access operations based on performance modeling. The method shown in FIG. 12 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at block 1210.

At block 1210, a performance estimate is determined. The performance estimate may indicate an estimated number of cycles needed to perform a sequence of memory access operations using interlock memory 550. Flow proceeds to decision block 1220.

At decision block 1220, it is determined whether the performance estimate is acceptable. In some embodiments, this determination is based on whether a particular number of iterations of blocks 1210-1230 have been performed. In some embodiments, this determination is based on a desired performance estimate or some other threshold. In some embodiments, an optimal ordering may be acceptable, while in other embodiments sub-optimal orderings may be acceptable, e.g., based on some heuristic. If the performance is acceptable, flow proceeds to block 1240 and flow ends. Otherwise, flow proceeds to block 1230.

At block 1230, the sequence of memory access operations is rearranged or reordered. One example of such reordering is discussed above with reference to FIGS. 6A-6C. Flow proceeds to block 1210. In some embodiments, the rearranged sequences and/or performance estimates are stored, and one of the rearranged sequences is selected based on the performance estimates. In some embodiments, the selected sequence is used to compile a program and/or generate one or more interlock tables for interlock memory 550.

Figure 13:
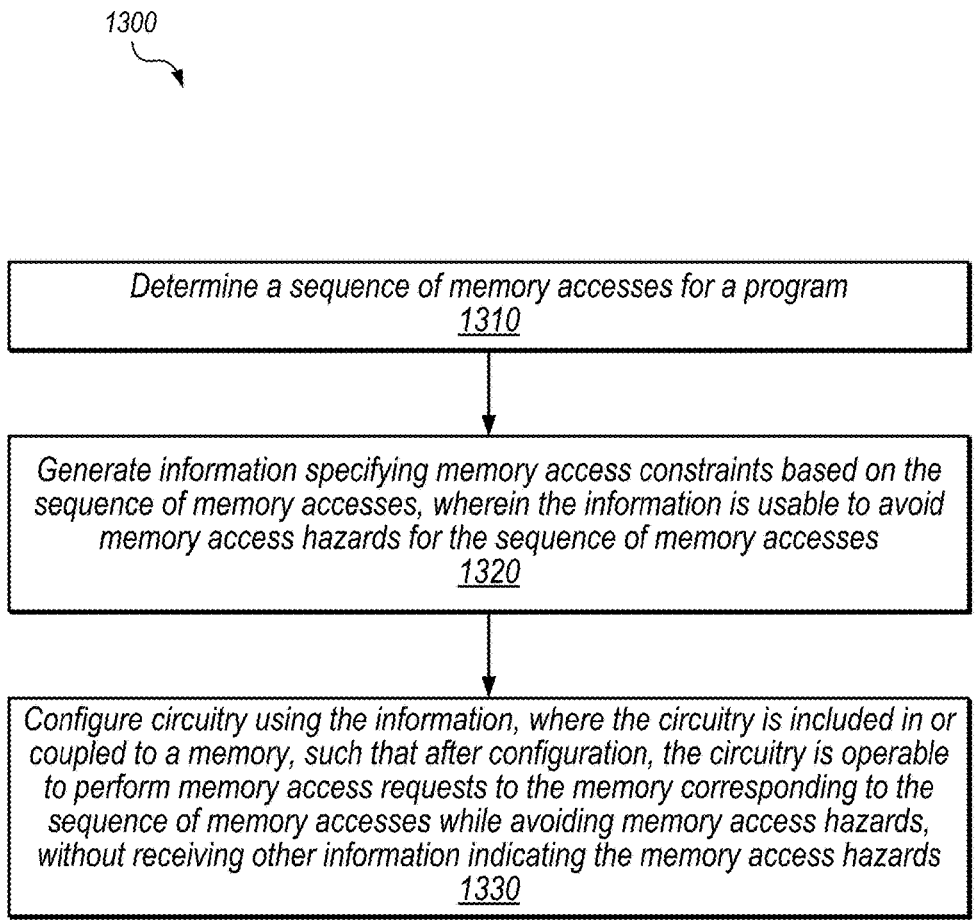
FIG. 13 illustrates one embodiment of a method for configuring an interlock memory.

FIG. 13 shows a flow diagram illustrating one embodiment of a method for configuring an interlock memory system. The method shown in FIG. 13 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at block 1310.

At block 1310, a sequence of memory accesses for a program is determined. In some embodiments, the sequence is determined based on compilation of an input program, e.g., per embodiments of the method of FIG. 11, discussed above. The sequence may be reordered, in some embodiments to improve performance of interlock memory 550. Flow proceeds to block 1320.

At block 1320, information specifying memory access constraints is generated, based on the sequence of memory accesses. In this embodiment, the information is usable to avoid memory access hazards for the sequence of memory accesses. In some embodiments, the information includes one or more interlock tables. Flow proceeds to block 1330.

At block 1330, circuitry is configured using the information. In this embodiment, the circuitry is included in or coupled to a memory. In this embodiment, the circuitry is operable, after the configuration, to perform memory access requests to the memory corresponding to the sequence of memory accesses while avoiding memory access hazards. In this embodiment, the circuitry is configured to avoid the memory access hazards without receiving other information indicating the memory access hazards (e.g., a program may send the sequence of memory access requests for pipelined execution without indicating memory access hazards and without waiting for a particular memory access to complete before sending dependent accesses). In some embodiment, the configuration is performed using one or more programmable hardware elements. In some embodiments, the configuration is performed by downloading values into one or more storage elements (e.g., one or more random access memories (RAMs) and/or one or more read only memories (ROMs)) included in and/or coupled to interlock memory 550. In some embodiments, circuitry is also configured with address information for self-addressing the memory accesses using any of various appropriate techniques. In some embodiments, method 1300 is performed automatically based on various inputs to a graphical program. Flow ends at block 1330.

Additional Interlock Memory Embodiments

Figure 14:
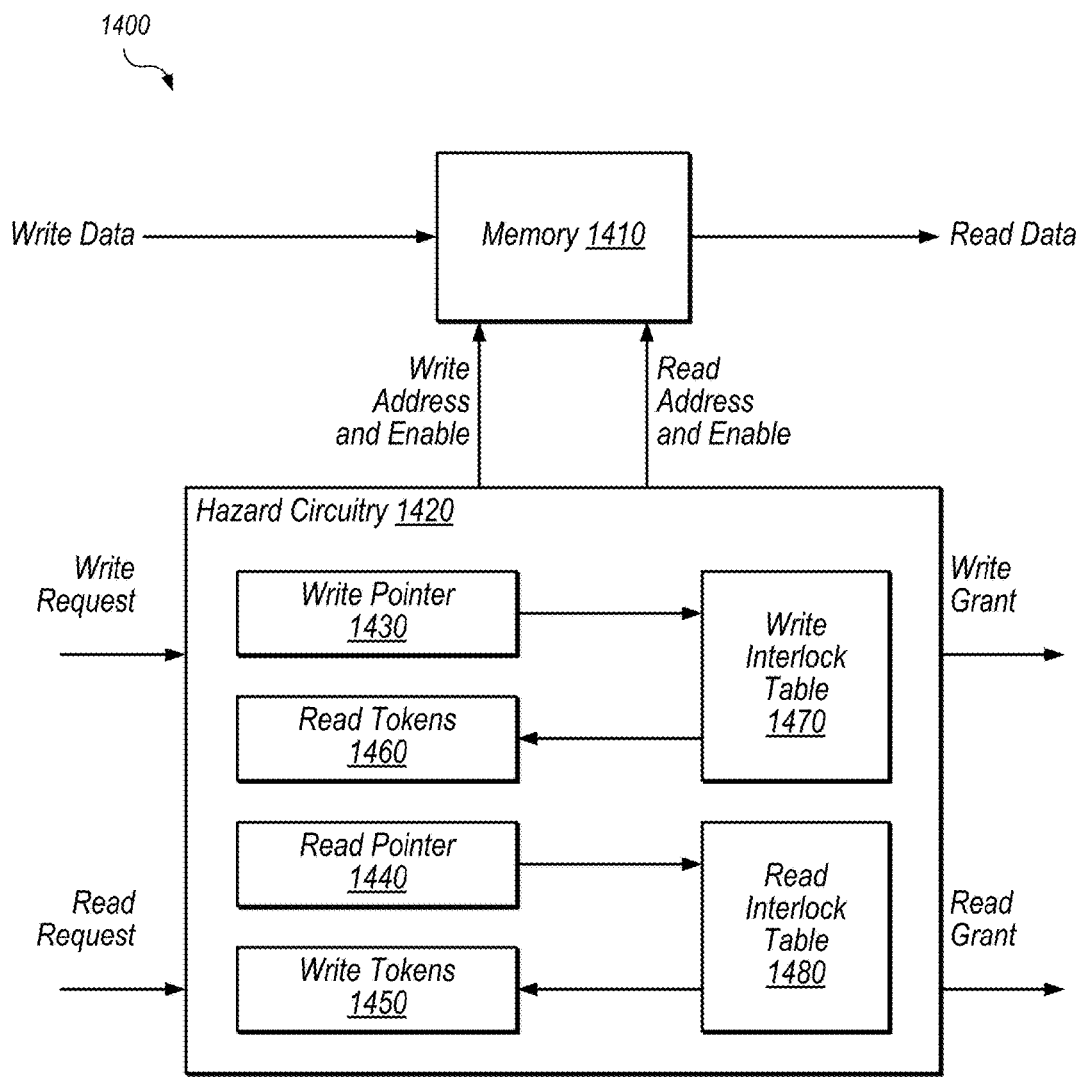
FIG. 14 is a block diagram illustrating another embodiment of an interlock memory.

FIG. 14 shows a block diagram illustrating one embodiment of a system 1400 configured to implement an interlock memory. FIGS. 15A-B and 16A-B illustrate exemplary interlock tables, execution timelines, and methods associated with system 1400 in some embodiments. System 1400, in the illustrated embodiment, includes memory 1410 and hazard circuitry 1420. Memory 1410, in some embodiments, is a shared memory.

Hazard circuitry 1420, in the illustrated embodiment, is configured to receive read and write requests and determine when to grant them in order to resolve hazards based on write interlock table 1470 and read interlock table 1480. Hazard circuitry 1420, in some embodiments, is integrated into the memory system that includes memory 1410. Hazard circuitry 1420, in the illustrated embodiment, includes write interlock table 1470, read interlock table 1480, and circuitry configured to maintain values for write pointer 1430, read pointer 1440, write tokens 1450, and read tokens 1460. In various embodiments, hazard circuitry may be distributed among elements of a pipelined data path. In some embodiments the information specified by write interlock table 1470 and read interlock table 1480 may not be directly stored, but may instead be used to configure hazard circuitry to perform various functionality described below.

Write tokens 1450 and read tokens 1460, in the illustrated embodiment, indicate how many reads or writes can be respectively performed before the next hazard, assuming the tokens are not incremented. For example, if read tokens 1460 has a value of three, then three reads can be performed before a potential hazard, assuming the value is not incremented as a result of writes in the interim.

Write pointer 1430 and read pointer 1440, in the illustrated embodiment, indicate the how many operations of each type have been performed in a sequence of memory accesses. In some embodiments, write pointer 1430 and read pointer 1440 are initialized to zero before execution of a given program and are incremented for each write and read respectively.

Write interlock table 1470 and read interlock table 1480, in the illustrated embodiment, indicate values to be added to read tokens 1460 or write tokens 1450 upon completion of particular read or write operations. These tables may be generated using compile time execution, generated based on user input, hard coded for a particular array or matrix, etc. Exemplary embodiments of values for these tables are discussed below with reference to FIGS. 15A-B.

Hazard circuitry 1420, in the illustrated embodiment, is configured to provide write address, write enable, read address, and read enable signals to memory 1410. In some embodiments, hazard circuitry 1420 is self-addressing and does not receive the address information during execution of a sequence of memory operations. In other embodiments, the addresses are included in the read and write requests.

FIGS. 15A-B show exemplary embodiments of interlock tables and pipelined execution for different exemplary sequences of memory access operations using system 1400. These Figures show that rearranging a sequence of memory accesses (e.g., rearranging beta matrix 1510 to produce beta matrix 1550 in the illustrated embodiment) may increase pipelined performance memory accesses using an interlock memory.

Beta matrix 1510, in the illustrated embodiment, includes two layers that each include three blocks. In the illustrated embodiment, the positions in the second layer of each table are shown using shaded blocks. Beta matrix 1550, in the illustrated embodiment, is generated by reordering the first layer of beta matrix 1510.

The execution diagrams illustrate exemplary pipelined performance of memory accesses for each of beta matrices 1510 and 1550. In the illustrated embodiment, upon completion of memory accesses for layer 2, execution begins again for layer 1. FIGS. 15A-B show that rearranging the order of memory access operations can improve performance, as the reordering to generate beta matrix 1550 has improved throughput relative to beta matrix 1510.

Write interlock tables 1520 and 1560 and read interlock tables 1530 and 1570, in the illustrated embodiment, include entries indicating the number of tokens to add upon completion of a corresponding operation in one of the beta matrices. For example, upon completion of a write to location 0 for layer 1 of beta matrix 1510, two read tokens are added, allowing at least two reads to occur before a stall to avoid the next potential hazard. As another example, upon completion of a write to location 4 for layer 2 of beta matrix 1510, four read tokens are added, allowing at least for reads to occur before a stall to avoid the next hazard. In the illustrated embodiment, each read operation adds a single write token. Note that in the illustrated embodiments, writes do not occur immediately after a token is added. In this embodiment, this is the result of the nature of the LDPC decoding operations, in which a program is configured to read all positions in a layer before writing any of them. Thus, when the first write request is received, in this example, the write tokens value has already been incremented to three based on the three reads.

Figures 16A, 16B:
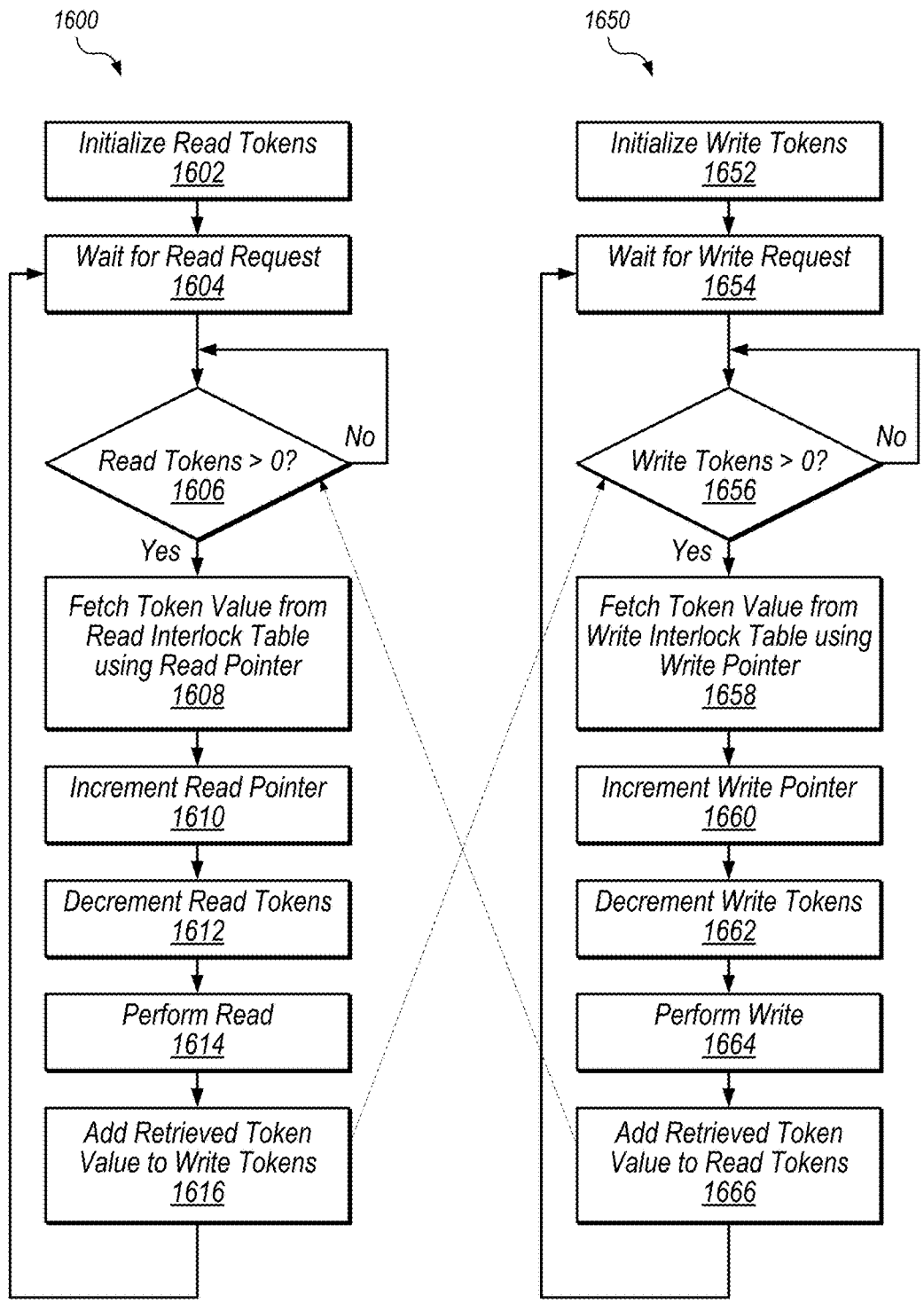
FIGS. 16A and 16B illustrate another embodiment of a method for operating an interlock memory.

FIGS. 16A-B show exemplary embodiments of methods 1600 and 1650 for operation of an interlock memory system, such as, for example, the embodiment of system 1400. The methods shown in FIGS. 16A-B may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at block 1602 for FIG. 16A and block 1652 for FIG. 16B. In some embodiments, these methods are performed (at least partially) in parallel.

Referring to FIG. 16A, at block 1602, hazard circuitry initializes a read tokens value. In the embodiments of FIGS. 15A-B, read tokens are initialized to a value of three while write tokens are initialized to a value of zero. Flow proceeds to block 1604.

At block 1604, hazard circuitry 1420 waits for a read request. Flow proceeds to decision block 1606.

At decision block 1606, hazard circuitry 1420 determines whether read tokens is greater than zero. If it is, flow proceeds to block 1608. Otherwise, flow remains at decision block 1606 until read tokens is greater than zero. As shown by the dashed arrow from block 1666 in FIG. 16B, read tokens may become greater than zero in response to a write operation, e.g., because performance of the write operation removes a hazard.

At block 1608 hazard circuitry 1420 fetches a token value from read interlock table 1470 based on the read pointer. In self-addressing embodiments, hazard circuitry 1420 is also configured to retrieve the read address from an address table. Note that in some embodiments, the interlock table may be configured to store addresses as well as indicate memory constraints. In these embodiments addresses may be retrieved from the interlock table in addition to interlock information. Flow proceeds to block 1610.

At block 1610, hazard circuitry 1420 increments the read pointer. Flow proceeds to block 1612.

At block 1612, hazard circuitry 1420 decrements the read tokens. In this embodiment, each read may be thought of as consuming a read token, such that reads are allowed to occur only if a read token is available. Flow proceeds to block 1614.

At block 1614, hazard circuitry 1420 performs the requested read operation. Flow proceeds to block 1616.

At block 1616, hazard circuitry 1420 adds the retrieved token value from block 1608 to write tokens. As shown by the dashed line from block 1616 to decision block 1656 of FIG. 16B, this incrementing may allow a waiting write to proceed because performance of the read in block 1614 may remove a hazard. Flow returns to block 1604.

Referring to FIG. 16B, at block 1652, hazard circuitry 1420 initializes a write tokens value. Flow proceeds to block 1654.

At block 1654, hazard circuitry 1420 waits for a write request. Flow proceeds to decision block 1656.

At decision block 1656, hazard circuitry 1420 determines whether write tokens is greater than zero. If it is, flow proceeds to block 1658. Otherwise, flow remains at decision block 1656 until write tokens is greater than zero.

At block 1658 hazard circuitry 1420 fetches a token value from write interlock table 1480 based on the write pointer. In self-addressing embodiments, hazard circuitry 1420 is also configured to retrieve the write address from an address table. Flow proceeds to block 1660.

At block 1660, hazard circuitry 1420 increments the write pointer. Flow proceeds to block 1662.

At block 1662, hazard circuitry 1420 decrements the write tokens. In this embodiment, each write may be thought of as consuming a write token, such that writes are allowed to occur only if a write token is available. Flow proceeds to block 1664.

At block 1664, hazard circuitry 1420 performs the requested write operation. Flow proceeds to block 1666.

At block 1666, hazard circuitry 1420 adds the retrieved token value from block 1608 to read tokens. As shown by the dashed line from block 1666 to decision block 1606 of FIG. 16A, this incrementing may allow a waiting read to proceed because performance of the write in block 1654 may remove a hazard. Flow returns to block 1654.

Note that FIGS. 14-16B illustrate exemplary token-based techniques for interlock tables while FIG. 9 illustrates an exemplary counter-based technique (e.g., each entry in interlock table 900 indicates the count or number of memory operations that must occur before a given access is allowed to proceed). In other embodiments, various other techniques may be used to indicate hazards using an interlock table and stall execution of memory accesses based on the interlock table. The disclosed embodiments are provided herein for exemplary purposes and are not intended to limit interlock table implementations in other embodiments.

In some embodiments, an interlock memory system may be configured with sets of memory access constraints for multiple different programs. In these embodiments, an indication of one of the different programs may be transmitted to the interlock memory system and the corresponding memory access constraints may be used to handle memory access requests for a given program. In various programmable embodiments, circuitry configured with a first set of memory access constraints for a first program may be re-configured with a second, different set of memory access constraints for a second program.

Re-configurable circuitry may be advantageous in various applications. For example, a user equipment device (UE) that includes re-configurable interlock circuitry may receive a new H matrix or beta matrix for LDPC-backed communications. In these embodiments, the UE may be configured to generate a program to implement LDPC decoding based on the received matrix. In other embodiments, the program may be transferred directly to the UE. In these embodiments, the UE may be configured to re-order memory accesses corresponding to the matrix in order to reduce pipelined execution time. In these embodiments, the UE is configured to configure hazard circuitry with a new set of memory access constraints for the communication. In some embodiments, the UE is configured to receive a set of memory access constraints for the program rather than generating them internally. In various embodiments, the UE may decode incoming wireless transmissions using the program and an interlock memory configured with the memory access constraints. In some embodiments, a UE that includes interlock memory configured to store memory access constraints for multiple programs may be configured to use different parity check techniques for different communications, e.g., when a device communicates via different networks.

Figure 17:
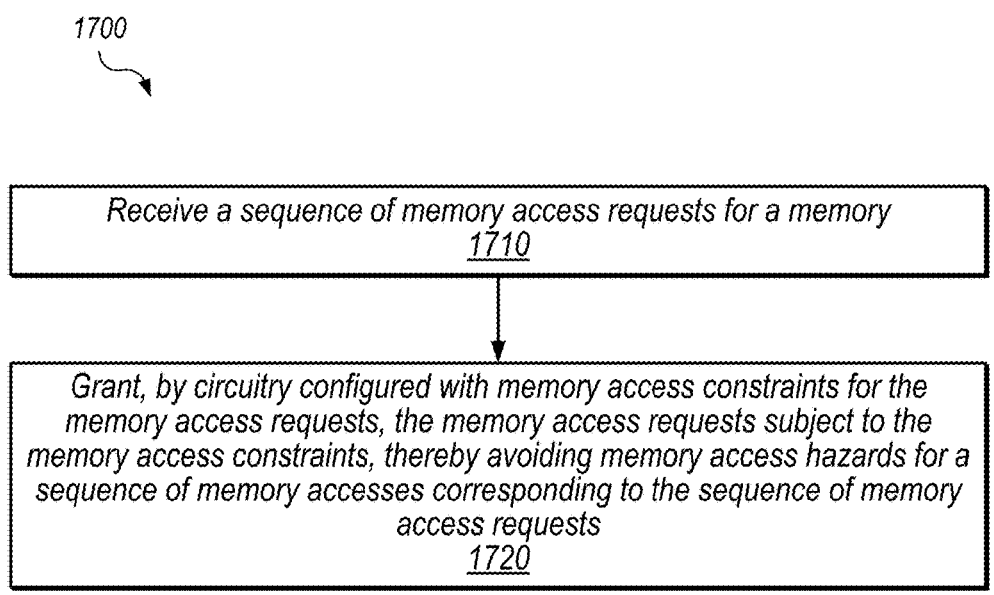
FIG. 17 illustrates one embodiment of a method performed using an interlock memory.

Referring now to FIG. 17, one generalized embodiment of a method 1700 for operating an interlock memory is shown. The method shown in FIG. 17 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at block 1710.

At block 1710, a sequence of memory access requests is received for a memory. In some embodiments, execution of a program generates the sequence of memory access requests. Flow proceeds to block 1720.

At block 1720, the memory access requests are granted by circuitry configured with memory access constraints for the memory access requests. In this embodiment, the circuitry is configured to grant the memory access requests subject to the memory access constraints, thereby avoiding memory access hazards for a sequence of memory accesses corresponding to the sequence of memory access requests. The circuitry may include one or more storage elements configured to store information specifying the memory access constraints. The circuitry may be programmable to grant the memory access requests based on the memory access constraints (e.g., the circuitry may include programmable hardware elements). The circuitry may be dedicated to granting the memory access requests based on the memory access constraints (e.g., the circuitry may be an ASIC). Flow ends at block 1720.

Figure 18:
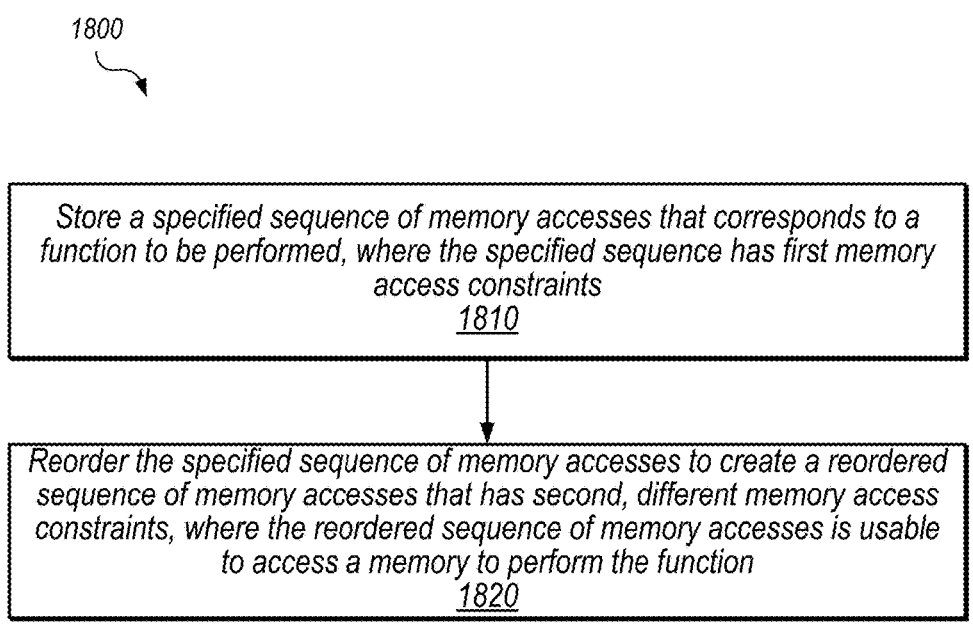
FIG. 18 illustrates one embodiment of a method for reordering sequences of memory accesses.

Referring now to FIG. 18, one generalized embodiment of a method 1800 for reordering a sequence of memory accesses is shown. The method shown in FIG. 18 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at block 1810.

At block 1810, a specified sequence of memory accesses is stored. The specified sequence may be received from another computing system or generated by the computing system storing the sequence, e.g., using compile-time execution. In this embodiment, the specified sequence corresponds to a function to be performed (such as LDPC decoding, for example) and has first memory access constraints. Flow proceeds to block 1820.

At block 1820, the specified sequence is reordered to create a reordered sequence of memory accesses that has second, different memory access constraints. In this embodiments, the reordered sequence of memory accesses is usable to access a memory to perform the function. The reordering may improve performance of the memory accesses using an interlock memory, as discussed above with reference to FIGS. 6C and 12. The reordering may be performed multiple times and a particular reordered sequence may be selected based on one or more criteria. The reordered sequence of memory accesses may have a greater memory access efficiency than the original sequence of memory accesses. For example, the reordered sequence may be usable to perform the function in a smaller number of clock cycles than a number of clock cycles used to perform the function using the original sequence. Flow ends at block 1820.

In some embodiments, a computing system may compile a program to implement the reordered sequence of memory accesses. Execution of the program may generate a sequence of memory access requests corresponding to the reordered sequence of memory accesses. The memory access requests may be performed using an interlock memory.

Figure 19:
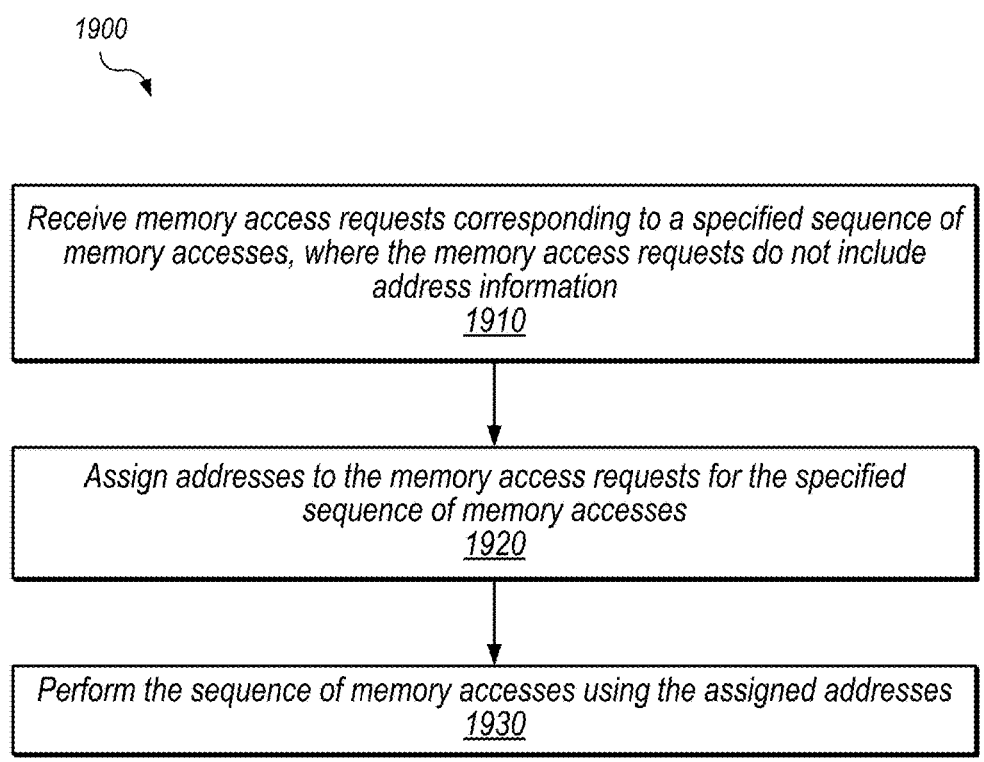
FIG. 19 illustrates one embodiment of a method performed using a self-addressing memory.

Referring now to FIG. 19, one generalized embodiment of a method 1900 for operating a self-addressing memory is shown. The method shown in FIG. 19 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at block 1910.

At block 1910, memory access requests are received, corresponding to a specified sequence of memory accesses, but the memory access requests do not include address information. For example, the memory access requests may be generated by an LDPC decoder program. The requests may specify whether a read or write operation is desired, but do not specify a location to be read/written. Flow proceeds to block 1920.

At block 1920, addresses are assigned to the memory accesses requests for the specified sequence of memory accesses. This may be performed by addressing circuitry configured with address information for the specified sequence of memory accesses. The addressing circuitry may be programmable or may be dedicated to a particular sequence. Flow proceeds to block 1930.

At block 1930, the sequence of memory accesses is performed using the assigned addresses. Flow ends at block 1930.

Figure 20:
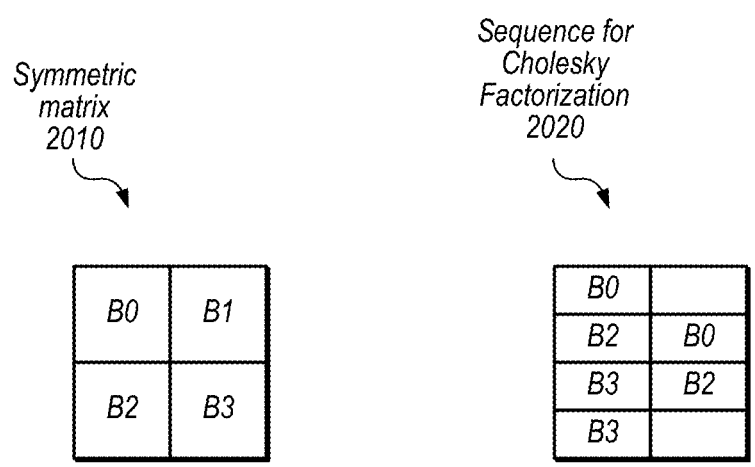
FIG. 20 illustrates a sequence of memory accesses for Cholesky factorization of a symmetric matrix.

Referring now to FIG. 20, a sequence of memory accesses 2020 for Cholesky factorization of a symmetric matrix 2010 is shown. In the illustrated embodiment, symmetric matrix 2010 is divided into 2×2 submatrix blocks B0-B3. Sequence 2020 captures the Choleskey factorization algorithm's sequence of read/modify/writes for these submatrix blocks. In the illustrated embodiment, for the second row, for example, B2 and B0 are read, potentially modified, and written before proceeding to row three. In other embodiments, similar sequences may be determined for any of various matrix operations. In some embodiments, various techniques described herein may be utilized for such sequences. For example, interlock information may be generated for sequence 2020, sequence 2020 may be rearranged to reduce memory access hazards, addresses may be generated for sequence 2020, etc.

Although the embodiments above have been described in considerable detail, numerous variations and modifications will become apparent to those skilled in the art once the above disclosure is fully appreciated. It is intended that the following claims be interpreted to embrace all such variations and modifications.

We claim:
1. A method, comprising:
receiving, by addressing circuitry during an execution of a program, memory access requests specified by instructions of the program, wherein the memory access requests correspond to a specified sequence of memory accesses from the program, wherein the memory access requests do not include address information; and
assigning, by the addressing circuitry, addresses to be accessed by ones of the memory access requests for the specified sequence of memory accesses, wherein the addressing circuitry is pre-configured with the addresses for the specified sequence of memory accesses prior to an apparatus that includes the addressing circuitry executing any instruction in the program; and
performing the memory access requests based on the assigned addresses.

2. The method of claim 1, wherein the specified sequence of memory accesses is determined during compilation of the program by executing portions of the program to determine the sequence of memory accesses.

3. The method of claim 1, further comprising storing addresses for the specified sequence of memory accesses.

4. The method of claim 1, further comprising configuring the addressing circuitry with information specifying addresses for a second sequence of memory accesses.

5. The method of claim 1, further comprising:
maintaining, by the addressing circuitry, a read counter for read accesses and a write counter for write accesses;

wherein the assigning is based on the read counter and the write counter.

6. The method of claim 1, wherein the specified sequence of memory accesses is based on a parity check matrix for a low-density parity-check (LDPC) decoder.

7. An apparatus, comprising:
a memory; and
addressing circuitry coupled to or comprised in the memory, wherein the addressing circuitry is configured to:
receive, during an execution of a program, memory access requests specified by instructions of the program, wherein the memory access requests correspond to a specified sequence of memory accesses from the program, wherein the memory access requests do not include address information; and
assign addresses to be accessed by ones of the memory access requests for the specified sequence of memory accesses, wherein the addressing circuitry is pre-configured with the addresses for the specified sequence of memory accesses prior to the apparatus executing any instruction in the program;
wherein the apparatus is configured to perform the memory access requests based on the assigned addresses.

8. The apparatus of claim 7, wherein the specified sequence of memory accesses is determined during compilation of the program by executing portions of the program to determine the sequence of memory accesses.

9. The apparatus of claim 7, wherein the addressing circuitry is configured to assign addresses to memory access requests for a second, different specified sequence of a second program where the requests in the second specified sequence do not include address information, based on an indication that the second program is being executed.

10. The apparatus of claim 7, wherein the addressing circuitry is further configured to:
maintain a read counter for read accesses to the memory and a write counter for write accesses to the memory; and
assign the addresses based on the read counter and the write counter.

11. The apparatus of claim 7, wherein the specified sequence of memory accesses includes non-sequential addresses and is based on a parity check matrix for a low-density parity-check (LDPC) decoder.

12. The apparatus of claim 7, wherein the memory is multi-ported and is configured to initiate a plurality of memory accesses in a given cycle.

13. An apparatus, comprising:
low density parity check code (LDPC) circuitry configured to perform LDPC decoding;
a memory configured to store data being decoded by the LDPC circuitry; and
addressing circuitry coupled to or comprised in the memory, wherein the addressing circuitry is configured to:
receive memory access requests specified by instructions of an LDPC decoding program, wherein the memory access requests correspond to a specified sequence of memory accesses for the LDPC decoding, wherein the memory access requests do not include address information; and
assign addresses to be accessed by ones of the memory access requests for the specified sequence of memory accesses, wherein the addressing circuitry is pre-configured with the addresses for the specified sequence of memory accesses prior to the apparatus executing any instruction in the LDPC program;
wherein the apparatus is configured to perform the memory access requests based on the assigned addresses.

14. The apparatus of claim 13, wherein the addressing circuitry is configured with the specified sequence of memory accesses by transferring information that specifies the specified sequence of memory accesses to a table.

15. The apparatus of claim 13, wherein the addressing circuitry includes one or more programmable hardware elements that are configurable to assign addresses to different sequences of memory accesses for different LDPC codes.

16. The apparatus of claim 13, wherein the specified sequence of memory accesses for the LDPC decoding is determined, prior to the LDPC decoding, during compilation of an LDPC decoding program.

17. The apparatus of claim 16, wherein the specified sequence of memory accesses for the LDPC decoding is determined by execution portions of the LDPC decoding program during compilation.

18. The apparatus of claim 13, wherein the addressing circuitry is configured to:
receive second memory access requests corresponding to a second specified sequence of memory accesses for the LDPC decoding, wherein the second memory access requests do not include address information; and
assign addresses to the second memory access requests for the second specified sequence of memory accesses, wherein the second specified sequence of memory accesses is determined and used to configure the addressing circuitry prior to the LDPC decoding.

19. The apparatus of claim 13, wherein the apparatus is configured to maintain a read counter for read accesses to the memory and a write counter for write accesses to the memory and is configured to assign the addresses based on the read counter and the write counter.

20. The apparatus of claim 13, wherein the memory access requests correspond to operations for rows of an LDPC parity check matrix.

* * * * *